(12) United States Patent
Kornachuk

(10) Patent No.: US 7,586,800 B1
(45) Date of Patent: Sep. 8, 2009

(54) MEMORY TIMING APPARATUS AND ASSOCIATED METHODS

(75) Inventor: Stephen Kornachuk, San Jose, CA (US)

(73) Assignee: Tela Innovations, Inc., Campbell, CA (US)

( * ) Notice: Subject to any disclaimer, the term of this patent is extended or adjusted under 35 U.S.C. 154(b) by 96 days.

(21) Appl. No.: 11/836,088

(22) Filed: Aug. 8, 2007

Related U.S. Application Data

(60) Provisional application No. 60/836,564, filed on Aug. 8, 2006.

(51) Int. Cl.
*G11C 7/00* (2006.01)
*G06F 12/00* (2006.01)

(52) U.S. Cl. .................. 365/196; 365/191; 365/194; 711/167

(58) Field of Classification Search .......... 365/191, 365/194, 196
See application file for complete search history.

(56) References Cited

U.S. PATENT DOCUMENTS

| | | | | |
|---|---|---|---|---|
| 4,197,555 | A | 4/1980 | Uehara et al. ............... | 357/70 |
| 5,378,649 | A | 1/1995 | Huang ....................... | 437/52 |
| 5,581,098 | A | 12/1996 | Chang ....................... | 257/211 |
| 5,682,323 | A | 10/1997 | Pasch et al. ............... | 364/491 |
| 5,684,733 | A | 11/1997 | Wu et al. ................... | 365/100 |
| 5,825,203 | A | 10/1998 | Kusunoki et al. ........... | 326/41 |
| 5,841,663 | A | 11/1998 | Sharma et al. .............. | 364/490 |
| 5,847,421 | A | 12/1998 | Yamaguchi ................. | 257/207 |
| 5,883,841 | A * | 3/1999 | Wendell ..................... | 365/190 |
| 5,898,194 | A | 4/1999 | Gheewala ................... | 257/206 |
| 5,908,827 | A | 6/1999 | Sirna ......................... | 514/12 |
| 5,923,059 | A | 7/1999 | Gheewala ................... | 257/204 |
| 5,935,763 | A | 8/1999 | Caterer et al. .............. | 430/313 |
| 5,977,305 | A | 11/1999 | Wigler et al. ............... | 530/350 |
| 6,100,025 | A | 8/2000 | Wigler et al. ............... | 435/6 |
| 6,174,742 | B1 | 1/2001 | Sudhindranath et al. ..... | 438/14 |
| 6,182,272 | B1 | 1/2001 | Andreev et al. ............. | 716/13 |
| 6,194,252 | B1 | 2/2001 | Yamaguchi ................. | 438/129 |
| 6,194,912 | B1 | 2/2001 | Or-Bach ..................... | 326/38 |

(Continued)

FOREIGN PATENT DOCUMENTS

WO  WO 2006/014849  2/2006

OTHER PUBLICATIONS

U.S. Appl. No. 60/625,342, filed May 25, 2006, Pileggi et al.

(Continued)

*Primary Examiner*—Ly D Pham
(74) *Attorney, Agent, or Firm*—Martine Penilla & Gencarella, LLP

(57) ABSTRACT

A computer memory includes a primary self-timing signal path defined by a model wordline signal path and a model bitline signal pair path. The primary self-timing signal path is defined to generate and transmit a model bitline signal pair. The computer memory also includes a control block defined to receive the model bitline signal pair from the primary self-timing signal path. The control block is defined to sense when a distinctive differential exists between the signals of the model bitline signal pair. The control block is further defined to generate and transmit a sense enable signal to a memory core upon sensing the distinctive differential between the signals of the model bitline signal pair.

31 Claims, 12 Drawing Sheets

U.S. PATENT DOCUMENTS

| | | | |
|---|---|---|---|
| 6,240,542 B1 | 5/2001 | Kapur | 716/12 |
| 6,255,600 B1 | 7/2001 | Schaper | 174/255 |
| 6,275,973 B1 | 8/2001 | Wein | 716/10 |
| 6,331,733 B1 | 12/2001 | Or-Bach et al. | 257/758 |
| 6,333,889 B1* | 12/2001 | Arimoto | 365/230.03 |
| 6,338,972 B1 | 1/2002 | Sudhindranath et al. | 438/14 |
| 6,416,907 B1 | 7/2002 | Winder et al. | 430/5 |
| 6,425,117 B1 | 7/2002 | Pasch et al. | 716/21 |
| 6,476,493 B2 | 11/2002 | Or-Bach et al. | 257/758 |
| 6,480,989 B2 | 11/2002 | Chan et al. | 716/8 |
| 6,505,327 B2 | 1/2003 | Lin | 716/5 |
| 6,525,350 B1 | 2/2003 | Kinoshita et al. | 257/202 |
| 6,536,028 B1 | 3/2003 | Katsioulas et al. | 716/17 |
| 6,571,140 B1 | 5/2003 | Wewalaarachchi et al. | 700/83 |
| 6,590,289 B2 | 7/2003 | Shively | 257/758 |
| 6,591,207 B2 | 7/2003 | Naya et al. | 702/81 |
| 6,620,561 B2 | 9/2003 | Winder et al. | 430/5 |
| 6,661,041 B2 | 12/2003 | Keeth | 257/211 |
| 6,691,297 B1 | 2/2004 | Misaka et al. | 716/21 |
| 6,714,903 B1 | 3/2004 | Chu et al. | 703/19 |
| 6,737,199 B1 | 5/2004 | Hsieh | 430/5 |
| 6,745,372 B2 | 6/2004 | Cote et al. | 716/2 |
| 6,792,593 B2 | 9/2004 | Takashima et al. | 716/21 |
| 6,795,952 B1 | 9/2004 | Stine et al. | 716/5 |
| 6,807,663 B2 | 10/2004 | Cote et al. | 716/21 |
| 6,819,136 B2 | 11/2004 | Or-Bach | 326/41 |
| 6,834,375 B1 | 12/2004 | Stine et al. | 716/2 |
| 6,850,854 B2 | 2/2005 | Naya et al. | 702/81 |
| 6,854,100 B1 | 2/2005 | Chuang et al. | 716/5 |
| 6,877,144 B1 | 4/2005 | Rittman et al. | 716/10 |
| 6,884,712 B2 | 4/2005 | Yelehanka et al. | 438/622 |
| 6,904,582 B1 | 6/2005 | Rittman et al. | 716/10 |
| 6,928,635 B2 | 8/2005 | Pramanik et al. | 716/21 |
| 6,931,617 B2 | 8/2005 | Sanie et al. | 716/18 |
| 6,953,956 B2 | 10/2005 | Or-Bach et al. | 257/203 |
| 6,978,437 B1 | 12/2005 | Rittman et al. | 716/21 |
| 6,992,925 B2 | 1/2006 | Peng | 365/177 |
| 7,028,285 B2 | 4/2006 | Cote et al. | 716/21 |
| 7,041,568 B2 | 5/2006 | Goldbach et al. | 438/387 |
| 7,064,068 B2 | 6/2006 | Chou et al. | 438/687 |
| 7,093,228 B2 | 8/2006 | Andreev et al. | 716/21 |
| 7,103,870 B2 | 9/2006 | Misaka et al. | 716/21 |
| 7,120,882 B2 | 10/2006 | Kotani et al. | 716/5 |
| 7,137,092 B2 | 11/2006 | Maeda | 716/8 |
| 7,149,999 B2 | 12/2006 | Kahng et al. | 716/19 |
| 7,155,689 B2 | 12/2006 | Pierrat | 716/4 |
| 7,278,118 B2 | 10/2007 | Pileggi et al. | 716/1 |
| 2003/0042930 A1 | 3/2003 | Pileggi et al. | 326/41 |
| 2003/0231527 A1* | 12/2003 | Nakase et al. | 365/196 |
| 2004/0145028 A1 | 7/2004 | Matsumoto et al. | 257/620 |
| 2004/0161878 A1 | 8/2004 | Or-Bach et al. | 438/113 |
| 2004/0243966 A1 | 12/2004 | Dellinger | 716/17 |
| 2005/0055828 A1 | 3/2005 | Wang et al. | 29/857 |
| 2005/0101112 A1 | 5/2005 | Rueckes et al. | 438/584 |
| 2005/0189614 A1 | 9/2005 | Ihme et al. | 257/532 |
| 2005/0224982 A1 | 10/2005 | Kemerling et al. | 257/758 |
| 2006/0112355 A1 | 5/2006 | Pileggi et al. | 716/1 |
| 2006/0121715 A1 | 6/2006 | Chang et al. | |
| 2006/0151810 A1 | 7/2006 | Ohshige | 257/207 |
| 2006/0223302 A1 | 10/2006 | Chang et al. | |

OTHER PUBLICATIONS

Wang, J. et al., Statndard Cell Layout with Regular Contact Placement, IEEE Trans. on Semicon. Mfg., vol. 17, No. 3, Aug. 2004.

Kang, S.M., Metal-Metal Matrix (M3) for High-Speed MOS VLSI Layout, IEEE Trans. on CAD, vol. CAD-6, No. 5, Sep. 1987.

Liebmann, L. W., Layout Impact of Resolution Enhancement Techniques: Impediment or Opportunity?, International Symposium on Physical Design, 2003.

Jhaveri, T. et al., Maximization of Layout Printability/Manufacturability by Extreme Layout Regularity, Proc. of the SPIE, Apr. 2006.

Acar, et al., "A Linear-Centric Simulation Framework for Parametric Fluctuations", 2002, IEEE, Carnegie Mellon University USA, pp. 1-8.

Amazawa, et al., "Fully Planarized Four-Level Interconnection with Stacked VLAS Using CMP of Selective CVD-A1 and Insulator and its Application to Quarter Micron Gate Array LSIs", 1995, IEEE, Japan, pp. 473-476.

Burkhardt, et al., "Dark Field Double Dipole Lithography (DDL) for Back-End-Of-Line Processes", 2007, SPIE Proceeding Series, vol. 6520; 65200K.

Capetti, et al., "Sub k1=0.25 Lithography with Double Patterning Technique for 45nm Technology Node Flash Memory Devices at λ=193nm", 2007, SPIE Proceeding Series, vol. 6520; 65202K.

Chandra, et al., "An Interconnect Channel Design Methodology for High Performance Integrated Circuits", 2004, IEEE, Carnegie Mellon University, pp. 1-6.

Cheng, et al., "Feasibility Study of Splitting Pitch Technology on 45nm Contact Paterning with 0.93 NA", 2007, SPIE Proceeding Series, vol. 6520; 65202N.

Chow, et al., "The Design of a SRAM-Based Field-Programmable Gate Array—Part II: Circuit Design and Layout", 1999, IEEE, vol. 7 # 3 pp. 321-330.

DeVor, et al., "Statistical Quality Design and Control", 1992, Macmillan Publishing Company, pp. 264-267.

Dusa, et al. "Pitch Doubling Through Dual Patterning Lithography Challenges in Integration and Litho Budgets", 2007, SPIE Proceeding Series, vol. 6520; 65200G.

El-Gamal, "Fast, Cheap and Under Control: The Next Implementation Fabric", Jun. 2-6, 2003, ACM Press, pp. 354-355.

Frankel, "Quantum State Control Interference Lithography and Trim Double Patterning for 32-16nm Lithography", 2007, SPIE Proceeding Series, vol. 6520; 65202L.

Hayashida, et al., "Manufactuable Local Interconnect technology Fully Compatible with Titanium Salicide Process", Jun. 11-12, 1991, VMIC Conference.

Heng, et al., "A VLSI Artwork Legalization Technique Base on a New Criterion of Minimum Layout Perturbation", 1997, ACM Press, pp. 116-121.

Hu, et al., "Synthesis and Placemant Flow for Gain-Based Programmable Regular Fabrics", Apr. 6-9, 2003, ACM Press, pp. 197-203.

Hutton, et al., "A Methodology for FPGA to Structured-ASIC Synthesis and Verification", 2006, EDAA, pp. 64-69.

Jayakumar, et al., "A Metal and VIA Maskset Programmable VLSI Design Methodology using PLAs", 2004, IEEE, pp. 590-594.

Kheterpal, et al., "Routing Architecture Exploration for Regular Fabrics", DAC, Jun. 7-11, 2004, ACM Press, pp. 204-207.

Kheterpal, et al., "Design Methodology for IC Manufactrability Based in Regular Logic-Bricks", DAC, Jun. 13-17, 2005, IEEE/AMC, vol. 6520.

Kim, et al., "Issues and Challenges of Double Patterning Lithography in DRAM", 2007, SPIE Proceeding Series, vol. 6520; 65200H.

Kim, et al., "Double Exposure Using 193nm Negative Tone Photoresist", 2007, SPIE Proceeding Series, vol. 6520; 65202M.

Koorapaty, et al., "Heterogeneous Logic Block Architectures for Via-Patterned Programmable Fabric", 13th International Conference on Field Programmable Logic and Applications (FPL) 2003, Lecture Notes in Computer Science (LNCS), Sep. 2003, Springer-Verlag, vol. 2778, pp. 426-436.

Koorapaty, et al., "Modular, Fabric-Specific Synthesis for Programmable Architectures", 12th International Conference on Field Programmable Logic and Applications (FPL$_{13}$2002, Lecture Notes in Computer Science (LNCS)), Sep. 2002, Springer-Verlag, vol. 2438 pp. 132-141.

Koorapaty, et al., "Exploring Logic Block Granularity for Regular Fabrics", 2004, IEEE, pp. 1-6.

Li, et al., "A Linear-Centric Modeling Approach to Harmonic Balance Analysis", 2002, IEEE, pp. 1-6.

Li, et al., "Nonlinear Distortion Analysis Via Linear-Centric Models", 2003, IEEE, pp. 897-903.

Liebmann et al., "Integrating DfM Components Into a Cohesive Design-To-Silicon Solution", IBM Systems and Technology Group, b IBM Research, pp. 1-12.

Liebmann, et al., "High-Performance Circuit Design for the RET-Enabled 65nm Technology Node", Feb. 26-27, 2004, SPIE Proceeding Series, vol. 5379 pp. 20-29.

Liu et al., "Double Patterning with Multilayer Hard Mask Shrinkage for Sub-0.25 k1 Lithography", 200, SPIE Proceeding Series, vol. 6520; 65202J.

Mo, et al., "Checkerboard: A Regular Structure and its Synthesis, International Workshop on Logic and Synthesis", 2003, Department of Electrical Engineering and Computer Sciences, UC Berkeley, California, pp. 1-7.

Mo, et al., "PLA-Based Regular Structures and Their Synthesis", 2003, Department of Electrical Engineering and Computer Sciences, IEEE, pp. 723-729.

Mo, et al., "Regular Farbrics in Deep Sub-Micron Integrated-Circuit Design", 2004, Kluwer Academic Publishers, Entire Book.

Op de Beek, et al., "Manufacturability issues with Double Patterning for 50nm half pitch damscene applications, using RELACS® shrink and corresponding OPC", 2007, SPIE Proceeding Series, vol. 6520; 65200I.

Or-Bach, "Programmable Circuit Fabrics", Sep. 18, 2001, e-ASIC, pp. 1-36.

Otten, et al., "Planning for Performance", DAC 1998, ACM Inc., pp. 122-127.

Pandini, et al., "Congestion-Aware Logic Synthesis", 2002, IEEE, pp. 1-8.

Pandini, et al., "Understanding and Addressing the Impact of Wiring Congestion During Technology Mapping", ISPD Apr. 7-10, 2002, ACM Press, pp. 131-136.

Patel, et al., "An Architectural Exploration of Via Patterned Gate Arrays, ISPD 2003", Apr. 6, 2003, pp. 184-189.

Pileggi, et al., "Exploring Regular Fabrics to Optimize the Performance-Cost Trade-Offs, Proceedings of the 40th ACM/IEEE Design Automation Conference (DAC) 2003", Jun. 2003, ACM Press, pp. 782-787.

Poonawala, et al., "ILT for Double Exposure Lithography with Conventional and Novel Materials", 2007, SPIE Proceeding Series, vol. 6520; 65202Q.

Ran, et al., "Designing a Via-Configurable Regular Fabric", Custom Integrated Circuits Coference (CICC). Proceedings of the IEEE, Oct. 2004, Oct. 1, 2004, pp. 423-426.

Ran, et al., "On Designing Via-Configurable-Cell Blocks for Regular Fabrics" Proceedings of the Design Automation Conference (DAC) 2004, Jun. 2004, ACM Press, s 198-203.

Ran, et al., "An Integrated Design Flow for a Via-Configurable Gate Array", 2004, IEEE, pp. 582-589.

Ran, et al., "Via-Configurable Routing Architectures and Fast Design Mappability Estimation for Regular Fabrics", 2005, IEEE, pp. 25-32.

Ran, et al., "The Magic of a Via-Configurable Regular Fabric", Proceedings of the IEEE International Conference on Computer Design (ICCD) Oct. 2004.

Reis, et al., "Physical Design Methodologies for Performance Predictability and Manufacturability", Apr. 14-16, 2004, ACM Press, pp. 390-397.

Robertson, et al., "The Modeling of Double Patterning Lithographic Processes", 2007, SPIE Proceeding Series, vol. 6520; 65200J.

Rovner, "Design for Manufacturability in Via Programmable Gate Arrays", May 2003, Graduate School of Cagegie Mellon University.

Sengupta, "An Integrated CAD Framework Linking VLSI Layout Editors and Process Simulators", 1998, Thesis for Rice University, pp. 1-101.

Sengupta, et al., "An Integrated CAD Framework Linking VLSI Layout Editors and Process Simulators", 1996, SPIE Proceeding Series, vol. 2726; pp. 244-252.

Sherlekar, "Design Considerations for Regular Fabrics", Apr. 18-21, 2004, ACM Press, pp. 97-102.

Stapper, "Modeling of Defects in Integrated Circuit Photolithographic Patterns", Jul. 1, 1984, IBM, vol. 28 # 4, pp. 461-475.

Taylor, et al., "Enabling Energy Efficiency in Via-Patterned Gate Array Devices", Jun. 7-11, 2004, ACM Press, pp. 874-877.

Tong, et al., "Regular Logic Fabrics for a Via Patterned Gate Array (VPGA), Custom Integrated Circuits Conference", Sep. 2003, Proceedings of the IEEE, pp. 53-56.

Vanleehgove, et al., "A Litho-Only Approach to Double Patterning", 2007, SPIE Proceeding Series, vol. 6520; 65202F.

Wenren, et al., "The Improvement of Photolithographic Fidelity of Two-dimensional Structures Though Double Exposure Method", 2007, SPIE Proceeding Series, vol. 6520; 65202I.

Wilcox, et al., "Design for Manufacturability: A Key to Semiconductor Manufacturing Excellence", 1998, IEEE, pp. 308-313.

Wu, et al., "A Study of Process Window Capabilities for Two-dimensional Structures under Double Exposure Condition", 2007, SPIE Proceeding Series, vol. 6520; 65202O.

Xiong, et al., "The Constrained Via Minimization Problem for PCB and VLSI Design", 1988, ACM Press/IEEE, pp. 573-578.

Yamamaoto, et al., "New Double Exposure Technique without Alternating Phase Shift Mask", 2007, SPIE Proceeding Series, vol. 6520; 652052P.

Yang, et al., "Interconnection Driven VLSI Module Placement Based on Quadratic Programming and Considering Congestion Using LFF Principles", 2004, IEEE, pp. 1243-1247.

Yao, et al., "Multilevel Routing With Redundant Via Insertion", Oct. 2006, IEEE, pp. 1148-1152.

Zheng, et al."Modeling and Analysis of Regular Symmetrically Structured Power/Ground Distribution Networks", DAC, Jun. 10-14, 2002, ACM Press, pp. 395-398.

Zhu, et al., "A Study of Double Exposure Process Design with Balanced Performance Parameters for Line/Space Applications", 2007, SPIE Proceeding Series, vol. 6520; 65202H.

Zuchowski, et al., "A Hybrid ASIC and FPGA Architecture", 2003, IEEE, pp. 187-194.

* cited by examiner

MEMORY TIMING APPARATUS AND ASSOCIATED METHODS

CLAIM OF PRIORITY

This application claims priority under 35 U.S.C. 119(e) to U.S. Provisional Patent Application No. 60/836,564, filed Aug. 8, 2006. This provisional application is incorporated herein by reference. This application is also related to U.S. patent application Ser. No. 11/836,099, filed on an even date herewith, and entitled "Speculative Sense Enable Tuning Apparatus and Associated Methods."

BACKGROUND

In certain types of computer memory, respective binary data is stored as a voltage level, i.e., high or low, in a number of storage cells. The storage cells are generally defined to accept a voltage level to be stored in a write operation, and drive a voltage stored therein in a read operation. More specifically, in a read operation of a particular storage cell, the voltage level present in the particular storage cell is driven on a pair of bitlines to a sense amplifier. When activated, i.e., enabled, the sense amplifier is defined to determine a voltage level present on the bitlines, and thereby determine the logic state of the binary data present in the storage cell.

A sense enable signal is transmitted to the sense amplifier to enable sensing of the bitlines connected to the sense amplifier. The data on the bitlines to be sensed by the sense amplifier should be in place, i.e., at the inputs of the sense amplifier, prior to receipt of the sense enable signal at the sense amplifier. Otherwise, the data may be missed by the sense amplifier. Also, the sense enable signal should arrive at the sense amplifier in a timely manner following receipt of the data to be sensed at the bitline inputs of the sense amplifier. Otherwise, an excessively delayed arrival of the sense enable signal at the sense amplifier may adversely affect memory performance, i.e., access speed, and correspondingly cause an unnecessary increase in memory power consumption. For example, a delay in shutdown of memory internal power-consuming activities, such as bitline discharge, may cause an unnecessary increase in memory power consumption. Therefore, it is necessary to control the timing of the sense enable signal to ensure that each sense amplifier of the computer memory is enabled in a timely manner after the appropriate data is available on the bitline inputs of the sense amplifier.

SUMMARY

In one embodiment, a computer memory is disclosed. The computer memory includes a primary self-timing signal path defined by a model wordline signal path and a model bitline signal pair path. The primary self-timing signal path is defined to generate and transmit a model bitline signal pair. The computer memory also includes a control block defined to receive the model bitline signal pair from the primary self-timing signal path. The control block is defined to sense when a distinctive differential exists between the signals of the model bitline signal pair. The control block is further defined to generate and transmit a sense enable signal to a memory core upon sensing the distinctive differential between the signals of the model bitline signal pair.

In another embodiment, a sense enable control module for a computer memory is disclosed. The sense enable control module includes a plurality of dummy sense amplifiers each connected to receive a model bitline signal pair. Each of the plurality of dummy sense amplifiers is defined to receive a dummy sense enable signal. Each of the plurality of dummy sense amplifiers is also defined to produce a dummy sense output signal indicative of whether a distinctive differential is sensed between the model bitline signal pair upon receipt of the dummy sense enable signal. The sense enable control module also includes a delay element chain including a plurality of serially connected delay elements. The delay element chain is connected to receive and propagate therethrough a fast timing signal. Each delay element in the delay element chain has an output connected to communicate a respective dummy sense enable signal to a respective one of the plurality of dummy sense amplifiers, such that the plurality of dummy sense amplifiers are enabled in a staggered temporal sequence according to a cumulative delay of the fast timing signal as propagated through the delay element chain. The sense enable control module further includes a memory core sense enable signal generator defined to receive the dummy sense output signal from each of the plurality dummy sense amplifiers. The memory core sense enable signal generator is defined to drive a sense enable signal for a memory core upon an initial receipt of a dummy sense output signal, from any one of the plurality of dummy sense amplifiers, indicative of the distinctive differential having been sensed between the model bitline signal pair.

In another embodiment, a method is disclosed for operating a computer memory. The method includes an operation for receiving a model bitline signal pair at inputs of each of a number of dummy sense amplifiers. The method also includes triggering operation of the number of dummy sense amplifiers in a staggered temporal sequence. An output signal of an initial one of the number of dummy sense amplifiers to sense a distinctive differential between the model bitline signal pair is transmitted to serve as a sense enable signal for the computer memory.

In another embodiment, a sense enable control module for a computer memory is disclosed. The sense enable control module includes a plurality of dummy sense amplifiers each connected to receive as inputs a model bitline signal pair. Each of the plurality of dummy sense amplifiers is defined to receive a respective dummy sense enable signal and produce a dummy sense output signal indicative of whether a distinctive differential is sensed between the model bitline signal pair upon receipt of the respective dummy sense enable signal. The sense enable control module also includes a delay element chain including a plurality of serially connected delay elements. The delay element chain is connected to receive and propagate therethrough a fast timing signal. Each delay element in the delay element chain has an output connected to communicate a respective dummy sense enable signal to a respective one of the plurality of dummy sense amplifiers, such that the plurality of dummy sense amplifiers are enabled in a staggered temporal sequence according to a cumulative delay of the fast timing signal as propagated through the delay element chain. The sense enable control module further includes an encoder module having an input defined to receive each of the dummy sense output signals produced by the plurality of dummy sense amplifiers. The encoder module is defined to determine which one of the plurality of dummy sense amplifiers initially senses a distinctive differential between the model bitline signal pair. The sense enable control module also includes a register having an input connected to receive a signal, from the encoder module, conveying an identity of the one dummy sense amplifier determined to have initially sensed the distinctive differential between the model bitline signal pair. The register is defined to store the identity and output the identity in a subsequent memory cycle. Additionally, the sense enable control module includes a multiplexer defined to receive as inputs each of the dummy sense enable signals generated by the plurality of delay elements in the delay element chain. The multiplexer is further defined to receive as a control signal the identity output from the register. The multiplexer is defined to output the received dummy sense enable signal that is communicated to enable the dummy sense amplifier identified by the control signal. The output of the multiplexer is communicated as a sense enable signal for the memory core.

In another embodiment, a method is disclosed for operating a computer memory. The method includes an operation for receiving a model bitline signal pair at inputs of each of a number of dummy sense amplifiers in a first memory cycle. Also in the first memory cycle, a first fast timing signal is propagated through a delay element chain. A respective delayed version of the first fast timing signal is output by each element in the delay element chain and is transmitted to trigger operation of a respective one of the number of dummy sense amplifiers in a staggered temporal sequence. An operation is also performed in the first memory cycle to store an identity of a delay element in the delay element chain whose output was used to trigger operation of an initial one of the number of dummy sense amplifiers to sense a distinctive differential between the model bitline signal pair. The method further includes an operation for propagating a second fast timing signal through the delay element chain in a second memory cycle. Also, an operation is performed in the second memory cycle to transmit, as a sense enable signal for the computer memory, the delayed version of the second fast timing signal as output by the delay element whose identity was stored in the first memory cycle.

In another embodiment, a computer memory is disclosed. The computer memory includes an active core sense amplifier defined to sense a differential between a bitline signal pair to be transmitted in the computer memory when the active core sense amplifier is triggered to perform a bitline sensing operation. The computer memory also includes a dummy sense amplifier defined as a substantially equivalent replica of the active core sense amplifier. The dummy sense amplifier has inputs connected to receive a substantially equivalent emulation of the bitline signal pair to be transmitted in the computer memory. The dummy sense amplifier is further defined to sense a differential between the emulated bitline signal pair when triggered at a specified time. The dummy sense amplifier is further defined to transmit a result of the emulated bitline sensing operation through an output. The computer memory also includes control circuitry defined to receive the result of the emulated bitline sensing operation from the output of the dummy sense amplifier. The control circuitry is further defined to trigger the active core sense amplifier to perform the bitline sensing operation at the specified time, when the received result of the emulated bitline sensing operation indicates that a distinctive differential was sensed between the emulated bitline signal pair by the dummy sense amplifier.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1A:
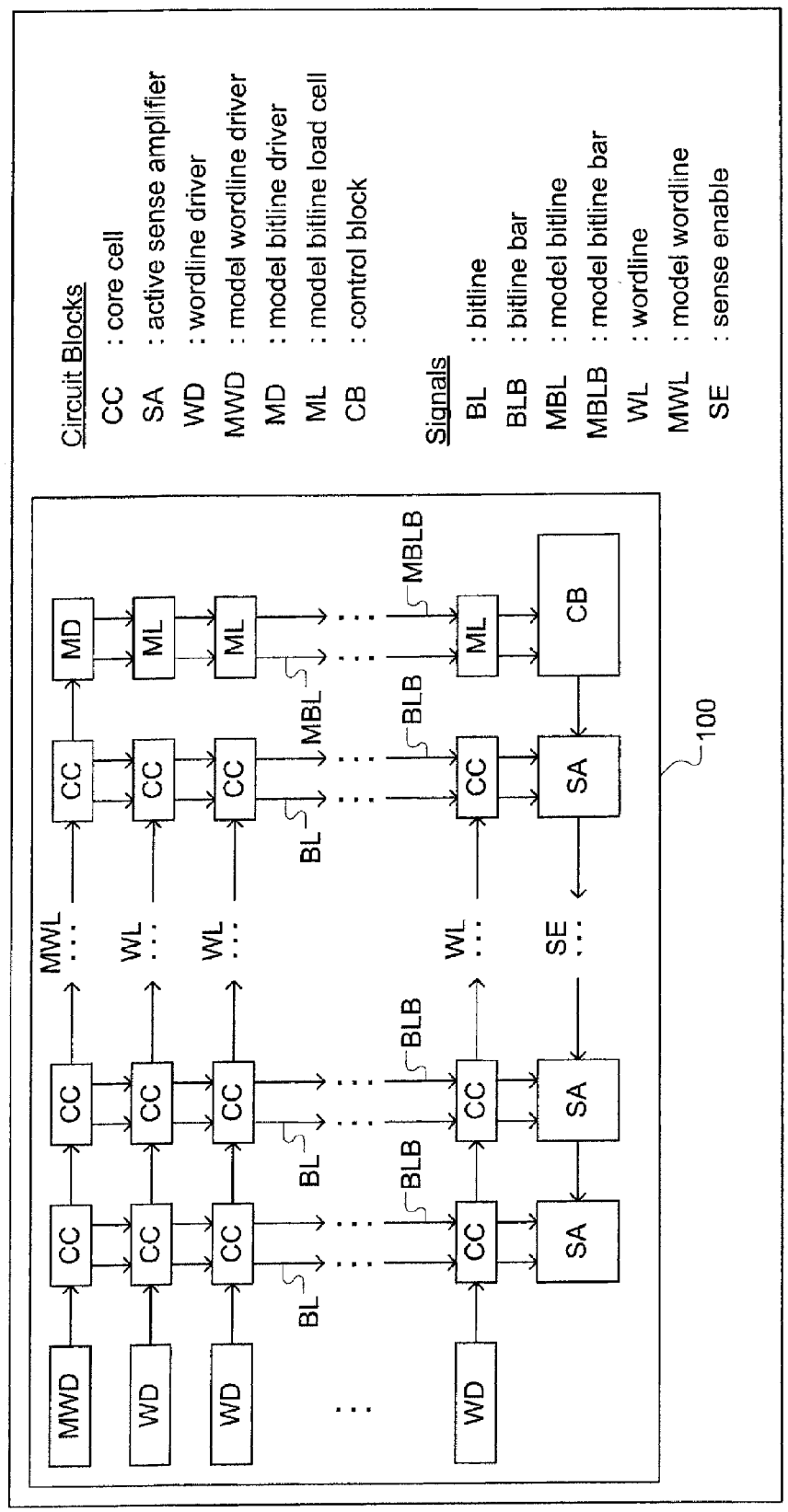
FIG. 1A is an illustration showing a computer memory, in accordance with one embodiment of the present invention.

FIG. 1A is an illustration showing a computer memory 100, in accordance with one embodiment of the present invention. The memory 100 includes a number of core cells (CC) defined in an array so as to form a number of rows of core cells (CC) and a number of columns of core cells (CC). Each core cell (CC) in a given row of core cells (CC) in the memory is connected to a common wordline (WL) driven by a respective wordline driver (WD). Thus, for descriptive purposes, each row of core cells (CC) is referred to as a wordline signal path. Each core cell (CC) in a given column of core cells (CC) in the memory is connected to a common bitline signal pair (BL/BLB). Each bitline signal pair (BL/BLB) is defined by a bitline signal (BL) and a bitline complement signal (BLB). For descriptive purposes, each column of core cells (CC) in the memory is referred to as a bitline signal pair path.

Figure 1B:
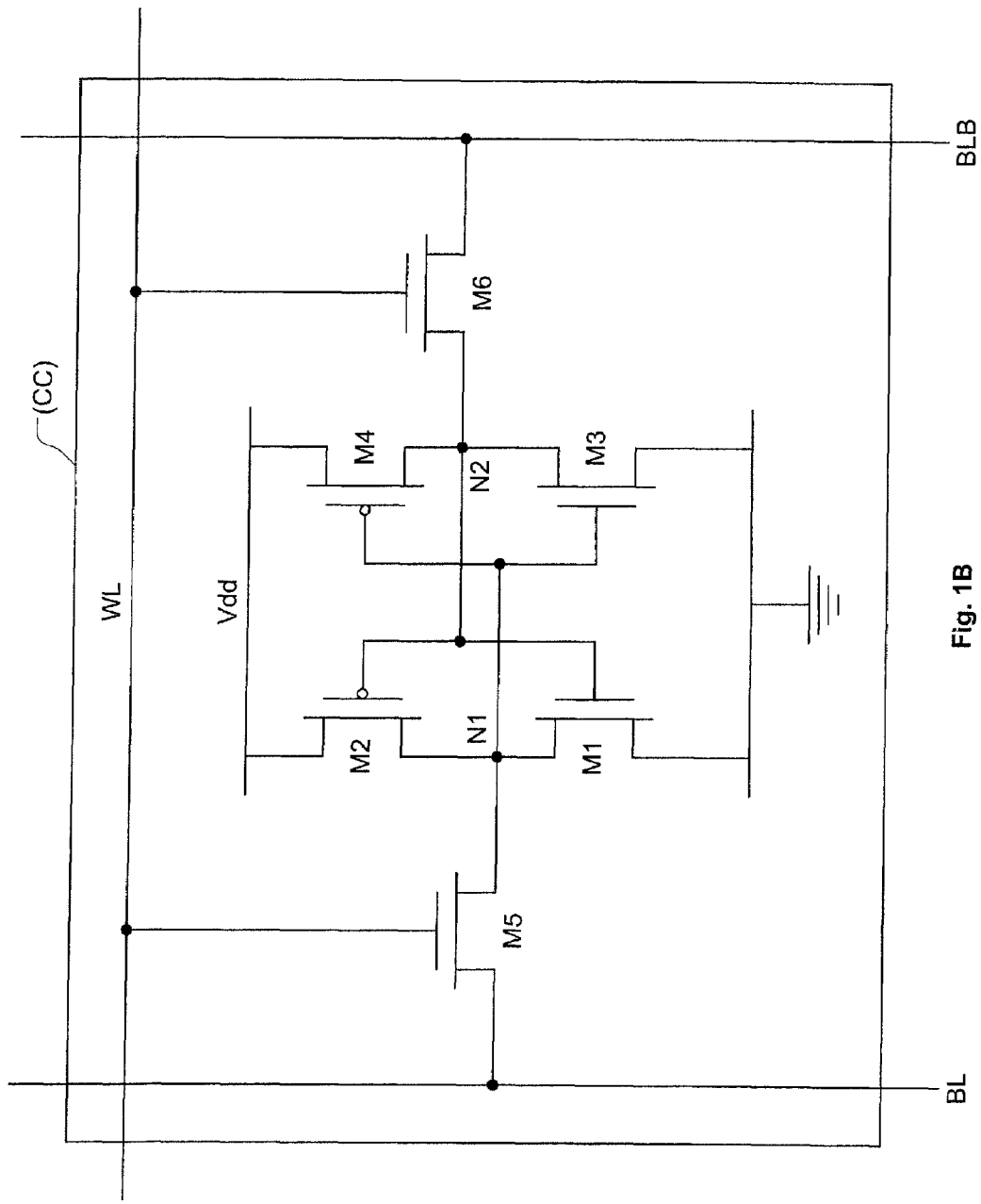
FIG. 1B is an illustration showing an exemplary core cell, in accordance with one embodiment of the present invention.

FIG. 1B is an illustration showing an exemplary core cell (CC), in accordance with one embodiment of the present invention. The core cell is essentially defined as a cross coupled latch defined to store/drive a logic state present therein on the bitline signal pair (BL/BLB) to which the core cell (CC) is connected when enabled by the wordline (WL) to which the core cell is connected. The core cell (CC) includes NMOS devices M5 and M6, each of which has a gate controlled by a signal present on the wordline (WL) to which the core cell (CC) is connected. The NMOS device M5 serves as a pass gate between the bitline signal (BL) and a storage node N1. Similarly, NMOS device M6 serves as a pass gate between the bitline complement signal (BLB) and a storage node N2. The storage node N1 is connected to control both a gate of a PMOS device M4 and a gate of an NMOS device M3. The PMOS device M4 serves as a pass gate between a reference voltage (Vdd) and the storage node N2. The NMOS device M3 serves as a pass gate between the storage node N2 and a reference ground potential. The storage node N2 is connected to control both a gate of a PMOS device M2 and a gate of an NMOS device M1. The PMOS device M2 serves as a pass gate between the reference voltage (Vdd) and the storage node N1. The NMOS device M1 serves as a pass gate between the storage node N1 and a reference ground potential. Thus, when storage node N1 is driven to a low voltage (low logic state), storage node N2 is drive to a high voltage (high logic state), vice versa. Consequently, when the wordline (WL) connected to the core cell (CC) is driven to a high logic state during a read cycle in which no other devices are driving the bitline signal pair (BL/BLB), the bitline signal (BL) connected to the core cell (CC) will be driven to the logic state stored at storage node N1, and the bitline complement signal (BLB) connected to the core cell (CC) will be driven to the logic state stored at storage node N2, which is opposite of the logic state stored at storage node N1.

With reference back to FIG. 1A, each bitline signal pair path is connected to a sense amplifier (SA). Each sense amplifier (SA) is defined to be activated upon receipt of a sense enable signal (SE) to sense a logic state represented by the bitline signal pair (BL/BLB), which represents the logic state stored in the core cell (CC) driving the bitline signal pair (BL/BLB). More specifically, each sense amplifier (SA) is defined to measure a differential signal between the bitline signal pair (BL/BLB). This differential indicates which logic state, i.e., high (1) or low (0), is stored in the core cell (CC) driving the bitline signal pair (BL/BLB). The sense enable signal (SE) tells the sense amplifier (SA) when to measure the differential between the bitline signal pair (BL/BLB) at its inputs.

The sense enable signal (SE) should be provided to a given sense amplifier (SA) at a time when a target bitline signal pair (BL/BLB) to be sensed is present at the inputs of the sense amplifier (SA). If the sensing operation is performed by the sense amplifier (SA) too early, due to a premature sense enable signal (SE), then insufficient bitline signal pair (BL/BLB) signal differential will have reached the inputs of the sense amplifier (SA) and a logic error could occur. Also, if the sensing operation is performed by the sense amplifier (SA) excessively late, due to an overdelayed sense enable signal (SE), following arrival of the target bitline signal pair (BL/BLB) signal differential at the inputs of the sense amplifier (SA), then the read operation will be delayed and the overall memory performance will slowed. Additionally, with an overdelayed sense enable signal (SE), the memory will be active for a longer period of time than necessary and use more power than necessary. Thus, having an overdelayed sense enable signal (SE) adversely affects memory speed and power utilization. A time period between arrival of the target bitline signal pair (BL/BLB) at the inputs of the sense amplifier (SA) and arrival of the sense enable (SE) at the sense amplifier (SA) is referred to as a sense margin. The sense margin should not be negative, thereby avoiding logic errors. However, the sense margin should be sufficiently small so as to optimize memory performance and power utilization. Preferably, the sense enable signal (SE) will reach the sense amplifier (SA) when there is just enough differential between the target bitline signal pair (BL/BLB) to get an accurate determination of the logic state stored within the core cell (CC) driving the target bitline signal pair (BL/BLB).

Given the foregoing, it should be understood that the sense enable signal (SE) needs to be generated and transmitted to each sense amplifier (SA) of the memory 100 in a manner that avoids premature sensing of the target bitline signal pair (BL/BLB) and maintains a sufficiently small sensing margin. The memory 100 includes a control block (CB) for generating the sense enable signal (SE) and transmitting the sense enable signal (SE) to the sense amplifiers (SA) of the memory 100 at an appropriate time. The control block (CB) is also referred to as the sense enable control module.

Figure 1C:
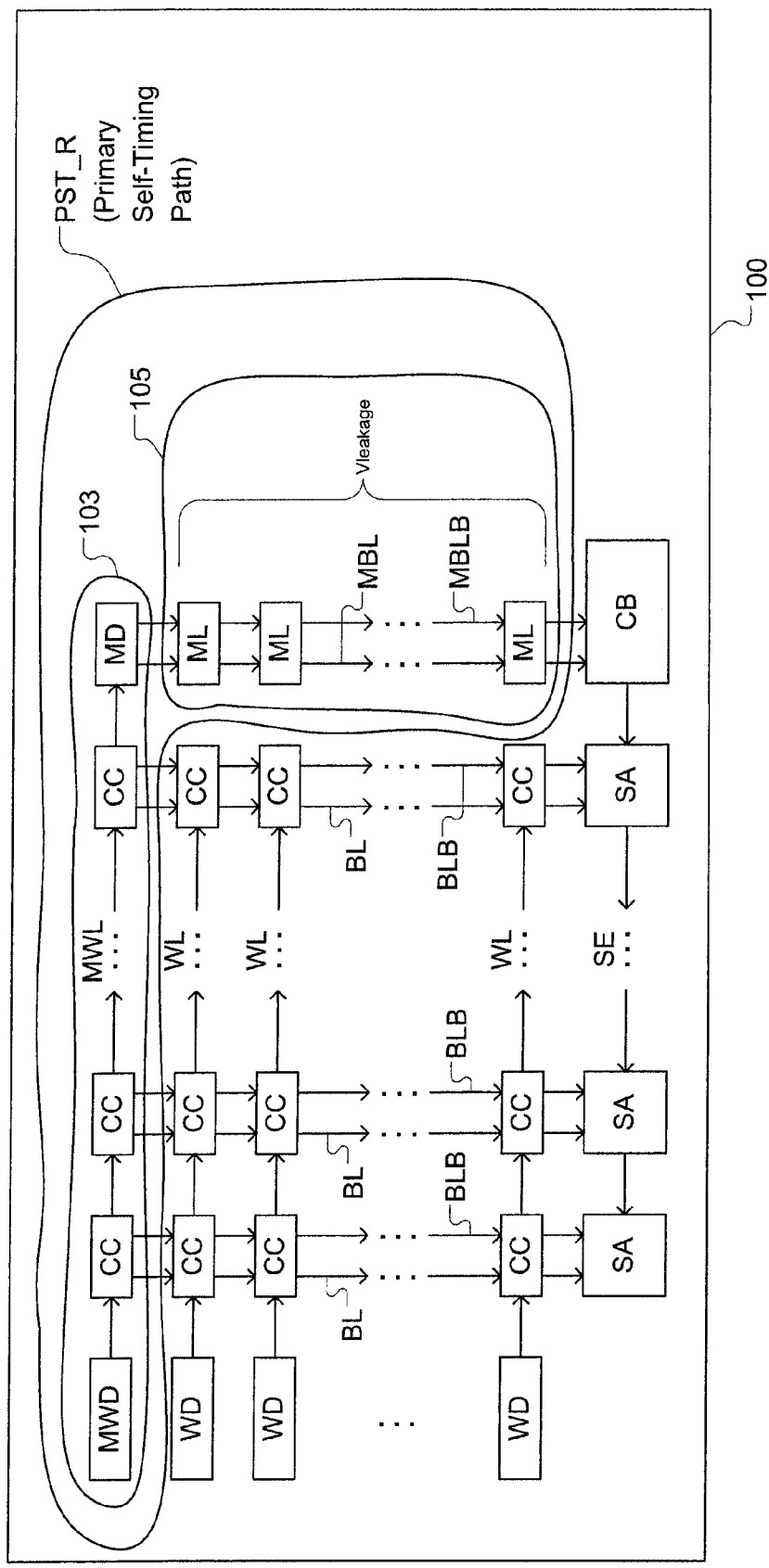
FIG. 1C is an illustration showing the primary self-timing path, in accordance with one embodiment of the present invention.

As shown in FIG. 1C, the memory 100 includes a primary self-timing signal path (PST_R) defined by a model wordline signal path 103 and a model bitline signal pair path 105. The primary self-timing signal path (PST_R) is defined to generate and transmit a model bitline signal pair to the control block (CB). The model wordline signal path 103 of the primary self-timing signal path (PST_R) is defined to emulate a wordline signal path within the core of the memory 100. The model bitline signal pair path 105 of the primary self-timing signal path (PST_R) is defined to emulate a bitline signal pair path within the core of the memory 100. The model wordline signal path 103 includes a number core cells (CC) connected to receive a model wordline signal when driven by a model wordline driver (MWD). The number of core cells (CC) defined along the model wordline signal path 103 is equal to the number of core cells (CC) defined along each wordline of the memory 100. Also, each core cell (CC) defined along the model wordline signal path 103 is defined to be substantially equivalent to a core cell (CC) within the memory 100. Additionally, the model wordline driver (MWD) is defined to be substantially equivalent to a wordline driver (WD) within the memory 100. Therefore, the model wordline signal path 103 is defined to be a substantial replica of a wordline path within the memory 100.

The model wordline signal path 103 is connected to terminate at a model bitline driver (MD). The model bitline driver (MD) is defined to be substantially equivalent to a core cell (CC) within the memory 100. The model bitline driver (MD) is defined to drive a model bitline signal pair (MBL/MBLB) through the model bitline signal pair path 105 to the control block (CB). The model bitline signal pair path 105 is connected to a number of model load cells (ML). In one embodiment, the number of model load cells (ML) is equal to a number of wordline signal paths within the core of the memory 100. Each model load cell (ML) is defined to be substantially equivalent to a core cell (CC) within the memory 100. In one embodiment, each model load cell (ML) is defined to store a logic state opposite of a logic state to be driven by the model bitline driver (MD), so as to emulate a worse case current leakage (Vleakage) that may occur through non-selected core cells (CC) along a bitline signal pair path within the core of the memory 100.

Given the above description of the primary self-timing path (PST_R), it should be appreciated that the model bitline signal pair (MBL/MBLB) is defined to arrive at inputs of the control block (CB) in a manner that substantially emulates arrival of the bitline signal pair (BL/BLB) at inputs of a sense amplifier (SA) of the core of the memory 100. The key time delay of the active path that is being replicated by the model timing path is the delay from the initiation of model bitline driver (MD) drive to the arrival of the model bitline signal pair (MBL/MBLB) at the control block. It should be appreciated that this key time delay optimally matches exactly the delay from the initiation of the wordline driver (WD) drive to the arrival of the active bitline signal pair (BL/BLB) at inputs of a sense amplifier (SA) of the core of the memory 100, even if the start time of the key time delay is not exactly synchronized between the active path and the model timing path. The control block (CB) is defined to receive the model bitline signal pair (MBL/MBLB) from the primary self-timing path (PST_R). The control block (CB) is defined to sense when a distinctive differential exists between the signals of the of the model bitline signal pair (MBL/MBLB). The control block (CB) is further defined to generate and transmit the sense enable signal (SE) to each of the sense amplifiers (SA) of the memory 100 upon sensing the distinctive differential between the signals of the model bitline signal pair (MBL/MBLB). It should be understood that in various embodiments the distinctive differential between the signals of the model bitline signal pair (MBL/MBLB) can be evaluated with regard to various electrical characteristics, such as voltage or current. Therefore, in one embodiment, the distinctive differential can refer to a distinctive differential voltage. In another embodiment, the distinctive differential can refer to a distinctive differential current. A number of control block (CB) embodiments are disclosed herein for generating the sense enable signal (SE) and transmitting the sense enable signal (SE) to the sense amplifiers (SA) of the memory 100 at an appropriate time.

Figure 2A:
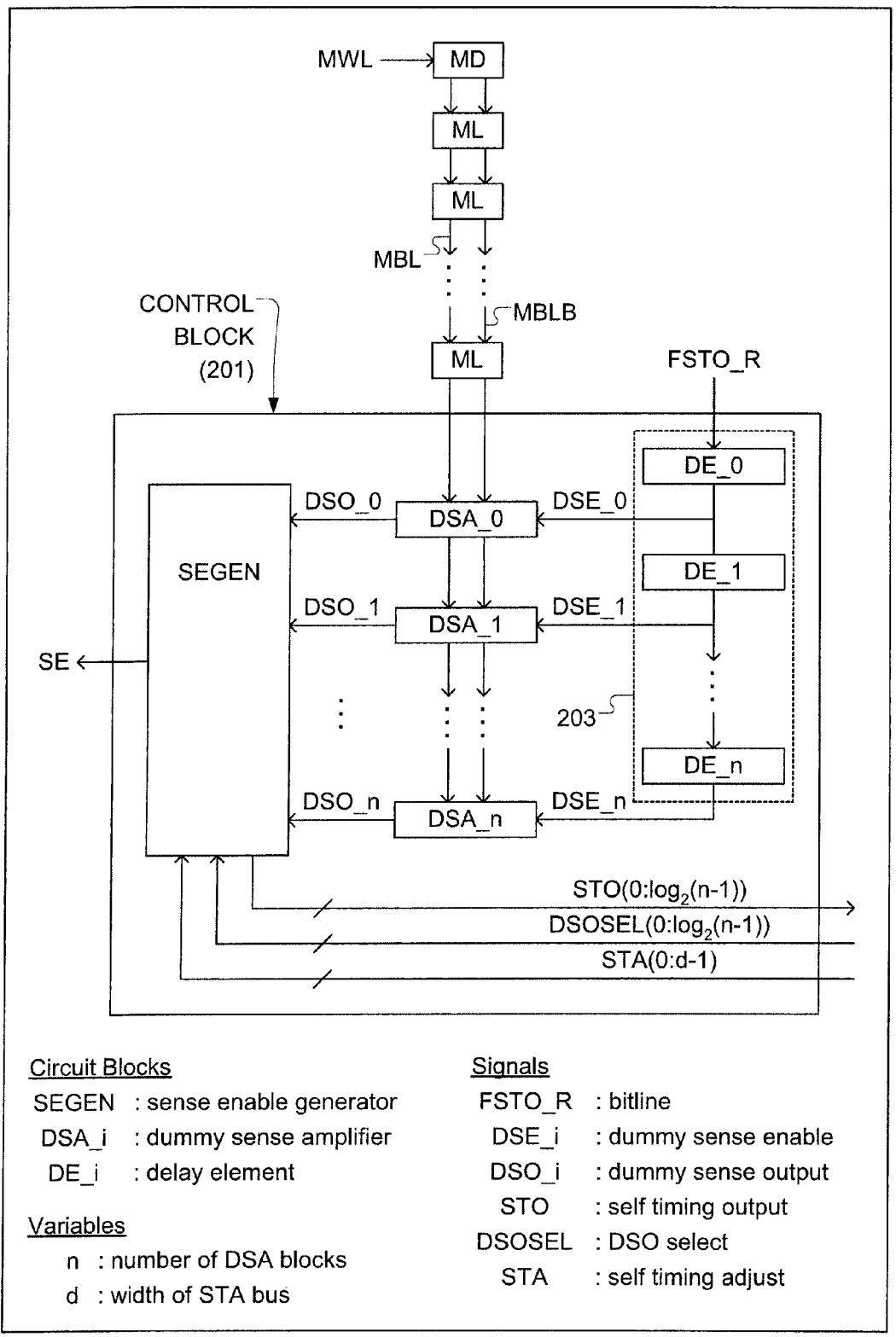
FIG. 2A is an illustration showing a control block, in accordance with one embodiment of the present invention.

FIG. 2A is an illustration showing a control block (CB) 201, in accordance with one embodiment of the present invention. The control block (CB) 201 is also referred to as a sense enable control module for a computer memory. The control block (CB) 201 is defined to include a number (n+1) of dummy sense amplifiers (DSA_0-DSA_n) connected to be enabled in a staggered temporal sequence. Each of the dummy sense amplifiers (DSA_0-DSA_n) is defined as a differential sense amplifier capable, upon enablement, of sensing whether a distinctive differential exists between the signals of the model bitline signal pair (MBL/MBLB) received at the inputs of the control block (CB) 201. The control block (CB) 201 is further defined to drive the sense enable signal (SE) for the memory 100 immediately upon an initial sensing by any one of the dummy sense amplifiers (DSA_0-DSA_n) of the existence of a distinctive differential between the signals of the model bitline signal pair (MBL/MBLB).

Each of the dummy sense amplifiers (DSA_0-DSA_n) is connected to receive the model bitline signal pair (MBL/MBLB). Also, each of the dummy sense amplifiers (DSA_0-DSA_n) is defined to receive a respective dummy sense enable signal (DSE_0-DSE_n). Upon receipt of its dummy sense enable signal (DSE_0-DSE_n), each of the dummy sense amplifiers (DSA_0-DSA_n) is defined to produce a respective dummy sense output signal (DSO_0-DSO_n) indicative of whether a distinctive differential is sensed between the model bitline signal pair (MBL/MBLB). The distinctive differential is defined as a minimum signal differential required between the inputs of a given dummy sense amplifier (DSA_0-DSA_n) for the given dummy sense amplifier (DSA_0-DSA_n) to sense a logic state represented by the signals present at the inputs of the given dummy sense amplifier (DSA_0-DSA_n).

Thus, each of the dummy sense amplifiers (DSA_0-DSA_n) is defined as a clocked differential sense amplifier. In one embodiment, each of the dummy sense amplifiers (DSA_0-DSA_n) is a substantially equivalent replica of a sense amplifier (SA) of the memory 100. Also, in one embodiment, each of the dummy sense amplifiers (DSA_0-DSA_n) is pre-biased to sense a logic state opposite of the logic state to be stored in the model bitline driver (MD) to compensate for slight offsets in the dummy sense amplifiers that may result in a falsely positive sensing result based on zero or insufficient signal differential in the model bitline signal pair (MBL/MBLB). If a given dummy sense amplifier (DSA_0-DSA_n) correctly senses the data driven by the model bitline driver (MD) onto the model bitline signal pair (MBL/MBLB), an unambiguous transition, such as a full rising edge, is driven by the given dummy sense amplifier (DSA_i, where 0<=i<=n) onto its output as the respective dummy sense output signal (DSO_i).

The control block (CB) 201 includes a delay element chain 203 defined to include a number of serially connected delay elements (DE_0-DE_n). The delay element chain 203 is connected to receive and propagate therethrough a fast timing signal (FSTO_R). Each delay element (DE_0-DE_n) in the delay element chain 203 has an output connected to communicate a respective dummy sense enable signal (DSE_0-DSE_n) to a respective one of the dummy sense amplifiers (DSA_0-DSA_n), such that the dummy sense amplifiers (DSA_0-DSA_n) are enabled in a staggered temporal sequence according to a cumulative delay of the fast timing signal (FSTO_R) as propagated through the delay element chain 203. Therefore, each dummy sense enable signal (DSE_0-DSE_n) comes from a respective delay element (DE_0-DE_n), thereby causing a given dummy sense enable signal (DSE_0-DSE_n) to be incrementally delayed relative to a previously transmitted dummy sense enable signal (DSE_0-DSE_n), or relative to the fast timing signal (FSTO_R) in the case of the first dummy sense enable signal (DSE_0).

In various embodiments, each delay element (DE_0-DE_n) is defined as a number of serially connected buffers, or as a number of serially connected inverters. It should be understood, however, that a given delay element (DE_0-DE_n) can be defined in essentially any manner so long as the delay of the fast timing signal (FSTO_R) through the given delay element is temporally well-behaved.

The size, i.e., delay amount, of each delay element (DE_0-DE_n) in the delay element chain 203 can be the same or can vary along the delay element chain 203. In one embodiment, the delay elements (DE_0-DE_n) are defined such that a cumulative delay of the fast timing signal (FSTO_R) as propagated through the delay element chain 203 increases in a substantially linear manner. For example, in this embodiment, the delay of the fast timing signal (FSTO_R) between the outputs of successive delay elements (DE_0-DE_n) increases by substantially the same amount. In another embodiment, the delay elements (DE_0-DE_n) are defined such that a cumulative delay of the fast timing signal (FSTO_R) as propagated through the delay element chain increases non-linearly. For example, in this embodiment, the delay of the fast-timing signal (FSTO_R) between the outputs of successive delay elements (DE_0-DE_n) increases by a larger amount, such that delay elements near a tail end (DE_n) of the delay element chain 203 are defined to delay the fast timing signal (FSTO_R) more than delay elements near a head end (DE_0) of the delay element chain 203.

Additionally, in one embodiment, the last delay element (DE_n) in the delay element chain 203 is defined to provide an extra large delay in the fast timing signal (FSTO_R) to ensure that the last dummy sense enable signal (DSE_n) is sufficiently delayed to ensure that the last dummy sense amplifier (DSA_n) will be operated to sense the differential between the model bitline signal pair (MBL/MBLB) after the model bitline signal pair (MBL/MBLB) has fully developed.

Thus, in this embodiment, the last delay element (DE_n) is defined as a "catch-all" delay element. In accordance with the foregoing, the operable delay bracket for sensing the model bitline signal pair (MBL/MBLB), in order to generate the sense enable signal (SE) for the memory 100, is defined to extend from the delay of the first delay element (DE_0) through the sum of the delays of all the delay elements (DE_0-DE_n).

Figure 2B:
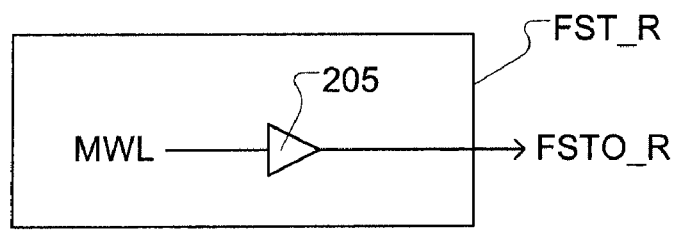
FIGS. 2B-2C are illustrations showing different instantiations of the fast self-timing path, in accordance with various embodiments of the present invention.
Figure 2C:
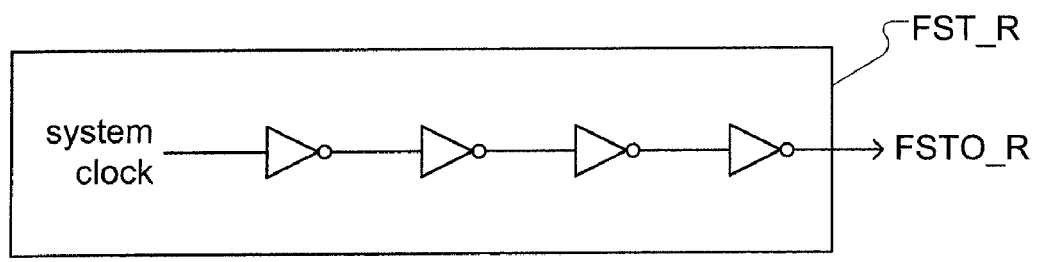

The fast timing signal (FSTO_R) is provided to the control block (CB) 201, and delay element chain 203 therein, as an output signal of a fast self-timing path (FST_R). FIGS. 2B-2C are illustrations showing different instantiations of the fast self-timing path (FST_R), in accordance with various embodiments of the present invention. In the embodiment of FIG. 2B, the fast self-timing path (FST_R) is defined such that the fast timing signal (FSTO_R) is generated as a buffered version of the model wordline signal (MWL). More specifically, the model wordline signal (MWL) is transmitted through a buffer 205 to generate the fast timing signal (FSTO_R) transmitted to the control block (CB) 201. In the embodiment of FIG. 2C, the fast self-timing path (FST_R) is defined to generate the fast timing signal (FSTO_R) as a buffered version of a system clock signal, wherein the system clock signal may be the memory 100 clock signal or another reference clock signal. In the example fast self-timing path (FST_R) of FIG. 2C, the system clock signal is transmitted through a number of inverters to generate the fast timing signal (FSTO_R) transmitted to the control block (CB) 201. It should be appreciated that the speed of the fast self-timing signal (FSTO_R) can be set arbitrarily. However, the fast self-timing signal (FSTO_R) should preferably arrive a the control block (CB) 201 at the same time or before the model bitline signal pair (MBL/MBLB) arrives at the control block (CB) 201.

It should be appreciated that the fast self-timing path (FST_R) is faster than the primary self-timing path (PST_R). In one embodiment, such as that of FIG. 2B, the fast self-timing path (FST_R) may re-use part of the primary self-timing path (PST_R), such as the model wordline signal (MWL), but preferably not the model bitline signal pair (MBL/MBLB). Also, in one embodiment, the fast self-timing path (FST_R) terminates in a single-ended full swing signal (FSTO_R). However, in other embodiments, the fast self-timing signal (FSTO_R) is not a single-ended full swing signal.

Referring back to FIG. 2A, the control block (CB) 201 includes a memory core sense enable signal generator (SEGEN) defined to receive the dummy sense output signal (DSO_0-DSO_n) from each of the plurality dummy sense amplifiers (DSA_0-DSA_n). The memory core sense enable signal generator (SEGEN) is defined to drive the sense enable signal (SE) for the core of the memory 100 upon receipt of the first dummy sense output signal (DSO_0-DSO_n) from any one of the plurality of dummy sense amplifiers (DSA_0-DSA_n) that is indicative of the distinctive differential having been sensed between the model bitline signal pair (MBL/MBLB). Thus, the memory core sense enable signal generator (SEGEN) is defined to drive the sense enable signal (SE) for the memory 100 based on the first successful dummy sense output signal (DSO_0-DSO_n) transition.

In one embodiment, a dummy sense output selection signal (DSOSEL) optionally allows a user to decide which dummy sense output signal (DSO_0-DSO_n) will trigger generation of the sense enable signal (SE) for the memory 100, thereby overriding use of the initially transitioned dummy sense output signal (DSO_0-DSO_n) to trigger generation of the sense enable signal (SE). It should be understood that in one embodiment the dummy sense output selection signal (DSOSEL) is a multi-bit signal conveyed on a multi-bit bus, where the number of bits represented in each of the multi-bit signal and the multi-bit bus is set to enable a unique identification of which dummy sense output signal (DSO_0-DSO_n) should be used to trigger generation of the sense enable signal (SE). Thus, the dummy sense output selection signal (DSOSEL) serves to provide an override signal identifying a particular one of the dummy sense amplifiers (DSA_0-DSA_n), and directing the memory core sense enable signal generator (SEGEN) to drive the sense enable signal (SE) upon receipt of the dummy sense output signal (DSO_0-DSO_n) from the particular one of the dummy sense amplifier (DSA_0-DSA_n) identified on the dummy sense output selection signal (DSOSEL). In some exemplary instances, the dummy sense output selection signal (DSOSEL) can be used for memory 100 testing purposes or for sense enable margining purposes.

In one embodiment, the memory core sense enable signal generator (SEGEN) is defined to receive a delay adjustment signal (STA) identifying an amount of time by which to delay a driving of the sense enable signal (SE) for the memory 100 following the initial receipt of a dummy sense output signal (DSO_0-DSO_n) indicating that a distinctive differential has been sensed between the model bitline signal pair (MBL/MBLB). It should be understood that in one embodiment the delay adjustment signal (STA) is a multi-bit signal conveyed on a multi-bit bus, where the number of bits represented in each of the multi-bit signal and the multi-bit bus is set to enable specification of an amount of delay by which driving of the sense enable signal (SE) should be increased or decreased. Therefore, the delay adjustment signal (STA) optionally allows a user to specify an adjustment to the delay between receipt of the initially transitioned dummy sense output signal and the transmission of the sense enable signal (SE). For example, a desired delay adjustment can be achieved by simply setting the various bits in the delay adjustment signal (STA), thereby enabling digital control of the delay adjustment. One method for specifying the timing adjustment is to specify a number of delay elements to subtract or add to the number that has been automatically determined.

In one embodiment, the memory core sense enable signal generator (SEGEN) is defined to provide a self-timing output signal (STO) identifying which one of the dummy sense amplifiers (DSA_0-DSA_n) provides the first dummy sense output signal (DSO_0-DSO_n) indicating that a distinctive differential has been sensed between the model bitline signal pair (MBL/MBLB). It should be understood that in one embodiment the self-timing output signal (STO) is a multi-bit signal conveyed on a multi-bit bus, where the number of bits represented in each of the multi-bit signal and the multi-bit bus is set to enable a unique identification of any one of the number of dummy sense output signals (DSO_i, $0<=i<=n$) received at the sense enable signal generator (SEGEN). For example, the self-timing output signal (STO) can provide the user with an identify of the particular dummy sense amplifier (DSA_0-DSA_n) used to trigger driving of the sense enable signal (SE) for the memory 100. In one embodiment, the STO signal may completely override the DSA input path and force the sense enable signal (SE) to be triggered by an unrelated input, such as a system clock.

Figure 3:
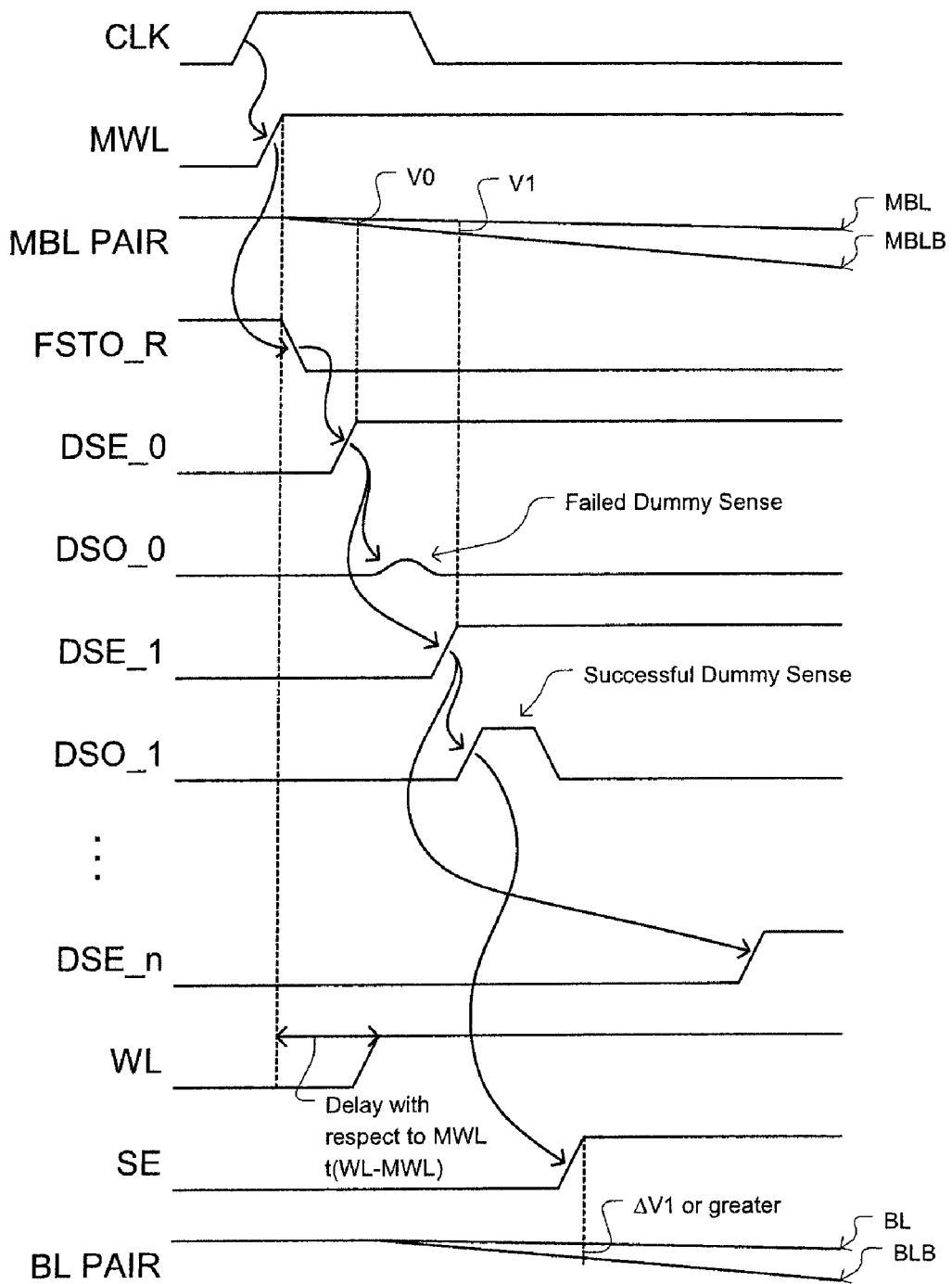
FIG. 3 is an illustration showing a number of exemplary signal waveforms associated with operation of the control block of FIG. 2A, in accordance with one embodiment of the present invention.

FIG. 3 is an illustration showing a number of exemplary signal waveforms associated with operation of the control block (CB) 201, in accordance with one embodiment of the present invention. A memory cycle begins at a leading edge of the memory clock signal (CLK). Upon initiation of the memory cycle, the model wordline signal (MWL) is driven high. The model wordline signal (MWL) will rise in advance of the active wordline signal (WL) by an amount referred to as t(WL−MWL). In response to model wordline signal (MWL) rising, the model bitline driver (MD) will generate the model bitline signal pair (MBL/MBLB). The model bitline signal pair (MBL/MBLB) should look essentially the same as the active core bitline pair (BL/BLB). In one embodiment, the model bitline signal (MBL) drops along with the model bitline complement signal (MBLB). It should be appreciated that due to the model load cells (ML), the rate of generation of signal differential on the active bitline signal pair (BL/BLB) due to leakage of the signal intended to be unchanged by the data state being driven should not be worse than the drop rate of the model bitline signal (MBL), thereby ensuring that timing of the generation of model bitline signal pair (MBL/MBLB) differential will bound a slowest timing of the active bitline signal pair (BL/BLB) differential generation.

Upon transition of the model wordline signal (MWL), the fast self-timing path (FST_R) will feed the delay element chain 203 in the control block (CB) 201 with the fast timing signal (FSTO_R). The output of each delay element (DE_0-DE_n) in the delay element chain 203 is used to clock the dummy sense amplifiers (DSA_0-DSA_n) of the control block (CB) 201. The amount of delay through the fast self-timing path (FST_R) combined with the cumulative delay provided by the delay element chain 203, through the delay element used to clock the dummy sense amplifier that is first to correctly sense the model bitline signal pair (MBL/MBLB), is the amount of delay required between the active wordline signal (WL) and the sense enable signal (SE) for the memory 100 to ensure proper sensing of the active bitline signal pair (BL/BLB) without excessive sensing margin.

For instance, in the example of FIG. 3, an insufficient differential voltage (V0) existed between the model bitline signal pair (MBL/MBLB) at the time the dummy sense amplifier (DSA_0) was enabled, thereby causing the dummy sense output signal (DSO_0) to indicate that a distinctive differential voltage had not yet been sensed between the model bitline signal pair (MBL/MBLB). Then, at the time the dummy sense amplifier (DSA_1) was enabled, a sufficient differential voltage (V1) had developed between the model bitline signal pair (MBL/MBLB) to cause the dummy sense amplifier (DSA_1) to sense the presence of a distinctive differential voltage, and cause the dummy sense output signal (DSO_1) to reflect the same. Receipt of the first high dummy sense output signal (DSO_1) by the memory core sense enable signal generator (SEGEN) cause the sense enable signal (SE) to be driven high. It should be understood that the initially asserted dummy sense output signal will trigger the first edge of the sense enable signal (SE) pulse. However, the trailing edge of the sense enable signal (SE) pulse can be defined by logic outside of the control block (CB) 201, thereby enabling independent control of the sense enable signal (SE) pulse width.

The control block (CB) 201 is defined to provide sense enable signal (SE) tuning within a single memory cycle. More specifically, the dummy sense amplifiers (DSA_0-DSA_n), the delay element chain 203, and the memory core sense enable signal generator (SEGEN) are collectively defined to operate within a single memory cycle to both determine an appropriate time at which the sense enable signal (SE) for the memory 100 is to be transmitted and drive the sense enable signal (SE) for the memory core at the appropriate time. Therefore, signal delay associated with the control block (CB) 201 circuitry may require that the primary self-timing path (PST_R) be triggered ahead of the wordline signal path of the active core of the memory 100. For example, the model wordline signal (MWL) may be triggered ahead of the actual wordline signal (WL), as shown in FIG. 3, to compensate for signal delay that is inherent in the logic of the control block (CB) 201. Signal delay t(WL−MWL) that is effectively eliminated from the model wordline signal (MWL) path, through advancement of the model wordline signal (MWL) relative to the active wordline signal (WL), should be from delay sources that are accurately modeled across process and environmental variables.

Figure 4:
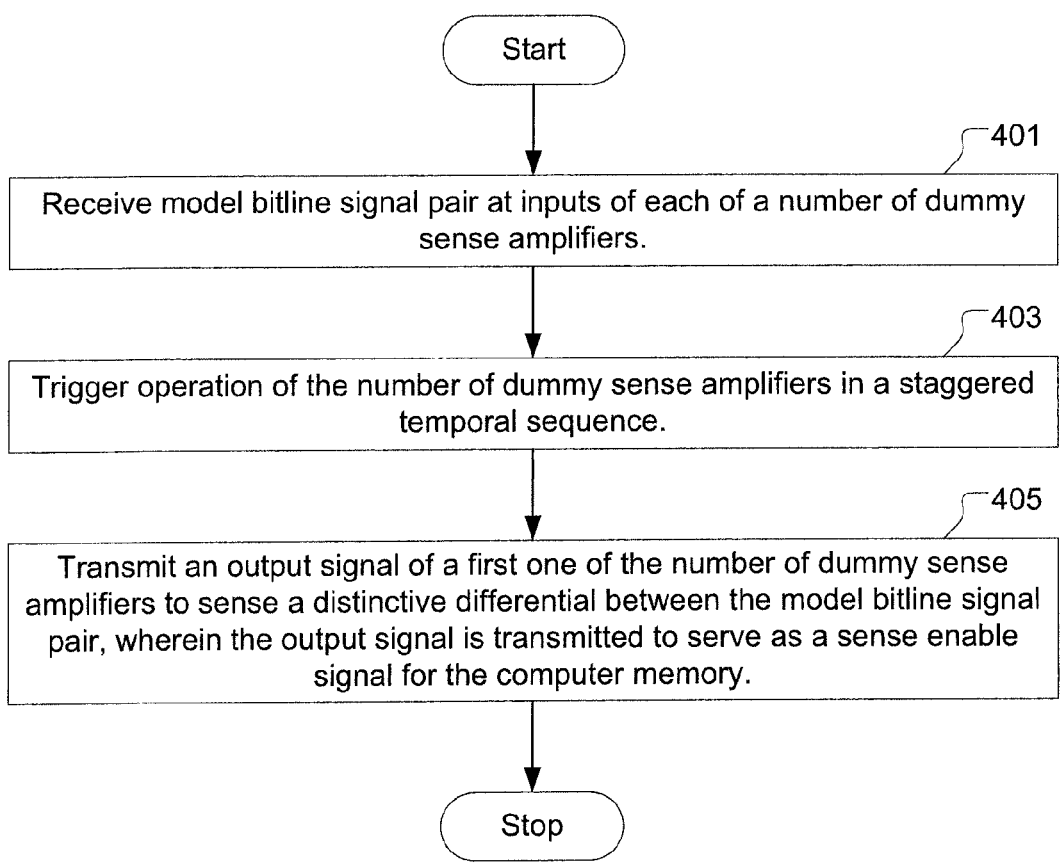
FIG. 4 is an illustration showing a flowchart of a method for operating a computer memory utilizing the control block of FIG. 2A, in accordance with one embodiment of the present invention.

FIG. 4 is an illustration showing a flowchart of a method for operating a computer memory utilizing the control block (CB) 201, in accordance with one embodiment of the present invention. The method includes an operation 401 for receiving a model bitline signal pair at inputs of each of a number of dummy sense amplifiers. The model bitline signal pair is received in a substantially simultaneous manner at the inputs of each of the number of dummy sense amplifiers. Also, the model bitline signal pair received at the inputs of each of the number of dummy sense amplifiers is defined to substantially emulate, with regard to signal characteristics and signal timing, a bitline signal pair to be received at a sense amplifier of the computer memory.

The method also includes an operation 403 for triggering operation of the number of dummy sense amplifiers in a staggered temporal sequence. In one embodiment, the operation 403 includes propagating a fast timing signal through a delay element chain, wherein a delayed version of the fast timing signal output by each element in the delay element chain is transmitted to enable a respective one of the number of dummy sense amplifiers so as to trigger operation of the number of dummy sense amplifiers in the staggered temporal sequence. In one embodiment, the staggered temporal sequence is controlled such that a substantially uniform time delay is provided between successive operation of dummy sense amplifiers. In another embodiment, the staggered temporal sequence is controlled such that a time delay between operation of successive ones of the number of dummy sense amplifiers increases in a non-linear fashion.

The method further includes an operation 405 for transmitting an output signal of a first one of the number of dummy sense amplifiers to sense a distinctive differential between the model bitline signal pair, wherein the output signal is transmitted to serve as a sense enable signal for the computer memory. In one embodiment, the operations 401, 403, and 405 are collectively performed in a single memory cycle. Also, in one embodiment, the method of FIG. 4 can include operations for receiving an override signal identifying a particular one of the number of dummy sense amplifiers, and in response to receipt of the override signal, transmitting an output signal of the particular one of the number of dummy sense amplifiers as the sense enable signal for the computer memory. Also, in one embodiment, the method of FIG. 4 can include an operation for delaying, by a user specified amount of time, the transmitting of the output signal of the initial one of the number of dummy sense amplifiers to sense the distinctive differential between the model bitline signal pair. The method of FIG. 4 can further include an operation for generating a diagnostic signal identifying the initial one of the number of dummy sense amplifiers to sense the distinctive differential between the model bitline signal pair.

The control block (CB) 201 operates on the basis that if a realistic model bitline path is successfully sensed by a dummy sense amplifier that is a substantial replica of a sense amplifier of the memory core, and is operated in the same way that a sense amplifier of an active bitline path in the memory core operates (i.e., clocked with low-swing differential inputs), then the output of the dummy sense amplifier in the model bitline signal path is a good predictor of the timing required for the active path sense enable signal. Thus, as described above, the control block (CB) 201 includes replicated dummy sense amplifiers that are activated at staggered time intervals. The dummy sense amplifier that is activated with sufficient delay to allow a large enough signal to develop on the model bitline signal pair for successful sensing will immediately drive a sense enable signal for the active path of the memory core.

The architecture of the control block (CB) 201 allows the circuits of the primary self-timing path (PST_R) to be precise replicas of active memory circuits, in both structure and operation. Combined with the technique of repeated dummy sense attempts, the precise replication of active memory circuits in the primary self-timing path (PST_R) increases the likelihood of successful memory operation under conditions of: inaccurate circuit modeling or verification, global variations in device or interconnect manufacturing, operating temperature, operating voltage, global changes to device or interconnect performance over time, or any other effects that cause timing impacts that differ between the active circuit path and a less-precise model or replica circuit path.

The derivation of sense enable signal (SE) timing and the drive thereof within the same memory cycle (i.e., memory clock signal cycle) allows the sense enable timing path of the memory to correctly respond, in a nearly instantaneous manner, to short term environmental changes, such as power supply glitches. Also, the self-timing nature of the control block (CB) 201 technique allows for more relaxed verification of the design, pre-silicon. This more relaxed verification can be leveraged to lower production/design costs or to improve schedule. Furthermore, the control block (CB) 201 support of differential model bitline sensing is advantageous as compared with single-ended model bitline sensing, as the single-ended model bitline sensing would likely require a speed-up of the model bitline driver to avoid excessive memory speed penalties. This required speed-up of the model bitline driver would likely require circuit changes that would diminish the model bitline signal path's ability to accurately emulate the active core bitline path behavior. In contrast, the model bitline driver (MD) of the primary self-timing path (PST_R) can be sized the same as a core cell (CC) of the memory, thereby causing a voltage spread between the model bitline signal pair (MBL/MBLB) to accurately reflect a voltage spread that would occur between an active bitline pair (BL/BLB).

The clocked model bitline sense provided by the control block (CB) 201 allows for faster model bitline sensing than would otherwise be achievable using an unclocked sense circuit. Furthermore, the clocked model bitline sense provided by the control block (CB) 201 allows for model bitline sensing through use of dummy sense amplifiers that are each a substantial replica of an active memory core sense amplifier. It should be further appreciated that leakage in the model load cell (ML) of the primary self-timing path (PST_R) accurately emulates leakage through unselected core cells (CC) in an active bitline column of the memory, thereby delaying the sense enable (SE) signal generation to ensure safe (i.e., logic error free) memory operation. Additionally, because the circuit element within the primary self-timing path (PST_R) and sense enable signal (SE) generation path through the control block (CB) 201 substantially match the circuit elements within the active path of the memory, particularly with regard to the model bitline signal pair (MBL/MBLB) generation, there is no need to target a "sweet-spot" of the memory (i.e., particular memory row, column, or other configuration parameter) to generate the sense enable signal (SE) at the appropriate time.

Figure 5:
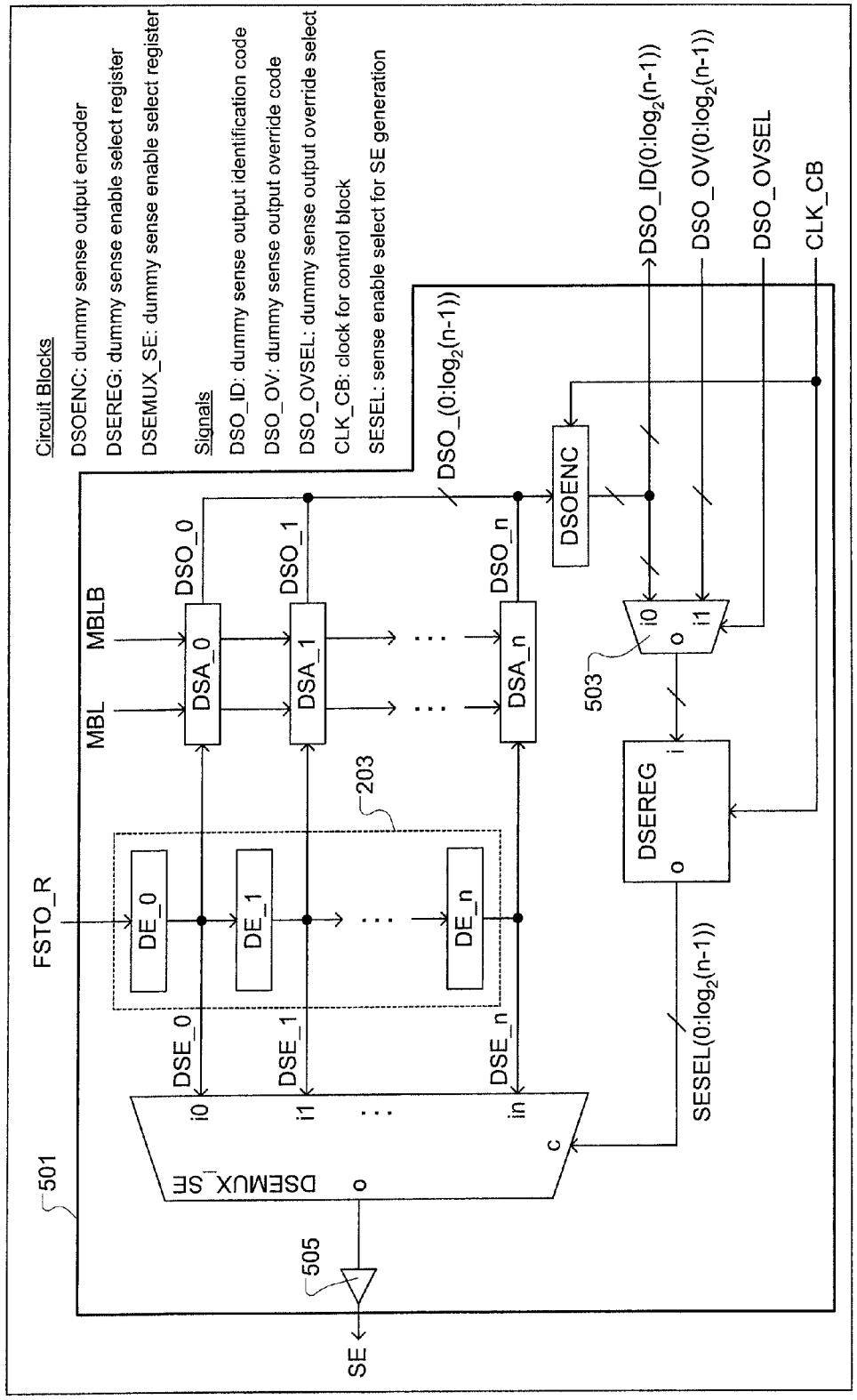
FIG. 5 is an illustration showing a control block defined to provide a next-cycle sense enable tuning capability, in accordance with one embodiment of the present invention.

FIG. 5 is an illustration showing a control block (CB) 501 defined to provide a next-cycle sense enable tuning capability, in accordance with one embodiment of the present invention. The control block (CB) 501 is also referred to as a sense enable control module for a computer memory. The control block (CB) 501 is connected to receive the model bitline signal pair (MBL/MBLB) from the same primary self-timing path (PST_R) as previously described with regard to control block (CB) 201. Also, the control block (CB) 501 is defined to receive the fast timing signal (FSTO_R) from the fast self-timing path (FST_R) in the same manner as previously described with regard to the control block (CB) 201.

As with the control block (CB) 201, the control block (CB) 501 is defined to include a number (n+1) of dummy sense amplifiers (DSA_0-DSA_n) connected to be enabled in a staggered temporal sequence. Each of the dummy sense amplifiers (DSA_0-DSA_n) is defined as a differential sense amplifier capable, upon enablement, of sensing whether a distinctive differential exists between the signals of the model bitline signal pair (MBL/MBLB) received at the inputs of the control block (CB) 501, and generating a respective dummy sense output signal (DSO_0-DSO_n) indicative of whether a distinctive differential is sensed between the model bitline signal pair (MBL/MBLB). Each of the dummy sense amplifiers (DSA_0-DSA_n) is defined as a substantially equivalent replica of a sense amplifier (SA) of the memory 100. In one embodiment, each of the dummy sense amplifiers (DSA_0-DSA_n) is defined to be pre-biased to sense a logic state opposite of a logic state to be communicated by the model bitline signal pair (MBL/MBLB).

The control block (CB) 501 is defined to store in a given memory cycle an identity associated with one of the dummy sense amplifiers (DSA_0-DSA_n) having initially sensed the existence of the distinctive differential between the signals of the model bitline signal pair (MBL/MBLB) in the given memory cycle. The control block (CB) 501 is further defined to drive the sense enable signal (SE) to the memory 100 core in a next memory cycle, in accordance with generation in the next memory cycle of a signal (DSE_0-DSE_n) used to enable the dummy sense amplifier (DSA_0-DSA_n) whose identity was stored in the previous memory cycle.

As with the control block (CB) 201, the control block (CB) 501 includes the delay element chain 203 defined to include the serially connected delay elements (DE_0-DE_n). The delay element chain 203 is connected to receive and propagate therethrough the fast timing signal (FSTO_R). Each delay element (DE_0-DE_n) in the delay element chain 203 has an output connected to communicate a respective dummy sense enable signal (DSE_0-DSE_n) to a respective one of the dummy sense amplifiers (DSA_0-DSA_n), such that the dummy sense amplifiers (DSA_0-DSA_n) are enabled in a staggered temporal sequence according to a cumulative delay of the fast timing signal (FSTO_R) as propagated through the delay element chain 203. In one embodiment, the delay elements (DE_0-DE_n) are defined such that a cumulative delay of the fast timing signal (FSTO_R) as propagated through the delay element chain 203 will increase linearly. In another embodiment, the delay elements (DE_0-DE_n) are defined such that a cumulative delay of the fast timing signal (FSTO_R) as propagated through the delay element chain 203 will increase non-linearly. For example, the delay elements near the tail end (DE_n) of the delay element chain 203 may provide a larger signal delay amount than the delay elements near the head end (DE_0) of the delay element chain 203.

The control block (CB) 501 also includes an encoder module (DSOENC) having an input defined to receive each of the dummy sense output signals (DSO_0-DSO_n) produced by the dummy sense amplifiers (DSA_0-DSA_n). The encoder module (DSOENC) is defined to determine which one of the dummy sense amplifiers (DSA_0-DSA_n) initially senses a distinctive differential between the model bitline signal pair (MBL/MBLB). More specifically, the encoder module (DSOENC) is defined to encode the block number corresponding to the dummy sense amplifier block that is first to successfully drive the correct transition on its output, and drive the encoded block number as a signal (DSO_ID). It should be understood that in one embodiment the signal (DSO_ID) is a multi-bit signal conveyed on a multi-bit bus, where the number of bits represented in each of the multi-bit signal and the multi-bit bus is set to enable a unique identification of the block number corresponding to the dummy sense amplifier block that is first to successfully drive the correct transition on its output. For example, if the fifth of eight dummy sense amplifier blocks drives a clear pulse on its output, while the initial four of the eight dummy sense amplifier blocks have unclear transitions on their outputs, the value of DSO_ID(0:7) will be [0010], with the leftmost bit in this notation corresponding to the least significant bit. In one embodiment, the encoded block number signal (DSO_ID) is user accessible as a diagnostic signal.

The control block (CB) 501 also includes a register (DSEREG) having an input (i) connected to receive the encoded block number signal (DSO_ID) from the encoder module (DSOENC) conveying an identity of the one dummy sense amplifier determined to have initially sensed the distinctive differential between the model bitline signal pair (MBL/MBLB). The register (DSEREG) is defined to store the identity (DSO_ID) and output the identity (DSO_ID) in a subsequent memory cycle as an identity signal (SESEL). The encoder module (DSOENC) and the register (DSEREG) are defined to operate in accordance with a common clock signal (CLK_CB) so as to maintain substantially synchronous operation. Thus, the register (DSEREG) prevents the identity signal (SESEL) from updating while the clock signal (CLK_CB) is high. In one embodiment, an override multiplexer 503 is connected between the encoder module (DSOENC) and the register (DSEREG), so as to enable substitution of a user specified identity signal (DSO_OV) for the identity (DSO_ID) conveyed from the encoder module (DSOENC). It should be understood that in one embodiment the identity signal (DSO_OV) is a multi-bit signal conveyed on a multi-bit bus, where the number of bits represented in each of the multi-bit signal and the multi-bit bus is set to enable a unique identification of any one of the dummy sense amplifiers (DSA_0-DSA_n). An override select signal (DSO_OVSEL) is provided to the override multiplexer 503 to control which of the identity signals (DSO_ID or DSO_OV) is conveyed to the register (DSEREG). For example, in a memory test mode, the identity signal (DSO_OV) may be programmed to use the output of the last delay element (DE_n) so as to delay the sense enable signal (SE) by the maximum amount possible to ensure that sense timing issues are avoided during performance of a memory yield analysis.

The control block (CB) 501 also includes a multiplexer (DSEMUX_SE) defined to receive as inputs each of the dummy sense enable signals (DSE_0-DSE_n) generated by the delay elements (DE_0-DE_n) in the delay element chain 203. The multiplexer (DSEMUX_SE) is further defined to receive as a control signal the identity signal (SESEL) output from the register (DSEREG). It should be understood that in one embodiment the identity signal (SESEL) received by the mutliplexer (DSEMUX_SE) is a multi-bit signal conveyed on a multi-bit bus, where the number of bits represented in each of the multi-bit signal and the multi-bit bus is set to enable a unique identification any one of the inputs received by the multiplexer (DSEMUX_SE). The multiplexer (DSEMUX_SE) is defined to output the received dummy sense enable signal communicated to enable the dummy sense amplifier identified by the control signal (SESEL). More specifically, the dummy sense enable signal for the dummy sense amplifier that is identified by the control signal (SESEL) is transmitted through the output of the multiplexer (DSEMUX_SE). The signal output by the multiplexer (DSEMUX_SE) is communicated as the sense enable signal (SE) for the memory 100. In one embodiment, a buffer 505 is connected to receive the output signal of the multiplexer (DSEMUX_SE) and drive a buffered version of the dummy sense enable signal as output by the multiplexer (DSEMUX_SE) as the sense enable (SE) signal for the memory 100. There is little signal delay associated with the multiplexer (DSEMUX_SE). Therefore, the delay in the sense enable signal (SE) is primarily defined by the delay element chain 203. It should be understood that a multiplexer as described herein represents any device that is defined to derive an output signal from any one of a number of input signals selected in accordance with a control signal.

In the control block (CB) 501, the dummy sense amplifiers (DSA_0-DSA_n), the delay element chain 203, the encoder module (DSOENC), and the register (DSEREG) are collectively defined to operate in a given memory cycle to determine a particular delay element in the delay element chain 203 that has an output signal generated at an earliest suitable time for use as the sense enable signal (SE) for the memory 100 core. Also, in the control block (CB) 501, the delay element chain 203, the multiplexer (DSEMUX_SE), and the register (DSEREG) are collectively defined to operate within a next memory cycle to transmit the sense enable signal (SE) for the memory 100 core as a buffered version of the output signal generated by the particular delay element as determined in the previous memory cycle and as identified in the register (DSEREG). Thus, in each memory cycle, the control block (CB) 501 operates to transmit an output signal of a particular delay element (DE_0-DE_n) as the sense enable signal (SE), wherein the particular delay element identity is obtained from the register (DSEREG), as stored in the previous memory cycle. Also, in each memory cycle, the control block (CB) 501 operates to determine which delay element (DE_0-DE_n) output signal is to be transmitted as the sense enable signal (SE) in the next memory cycle, and store the identity of the determined delay element in the register (DSEREG).

Figure 6:
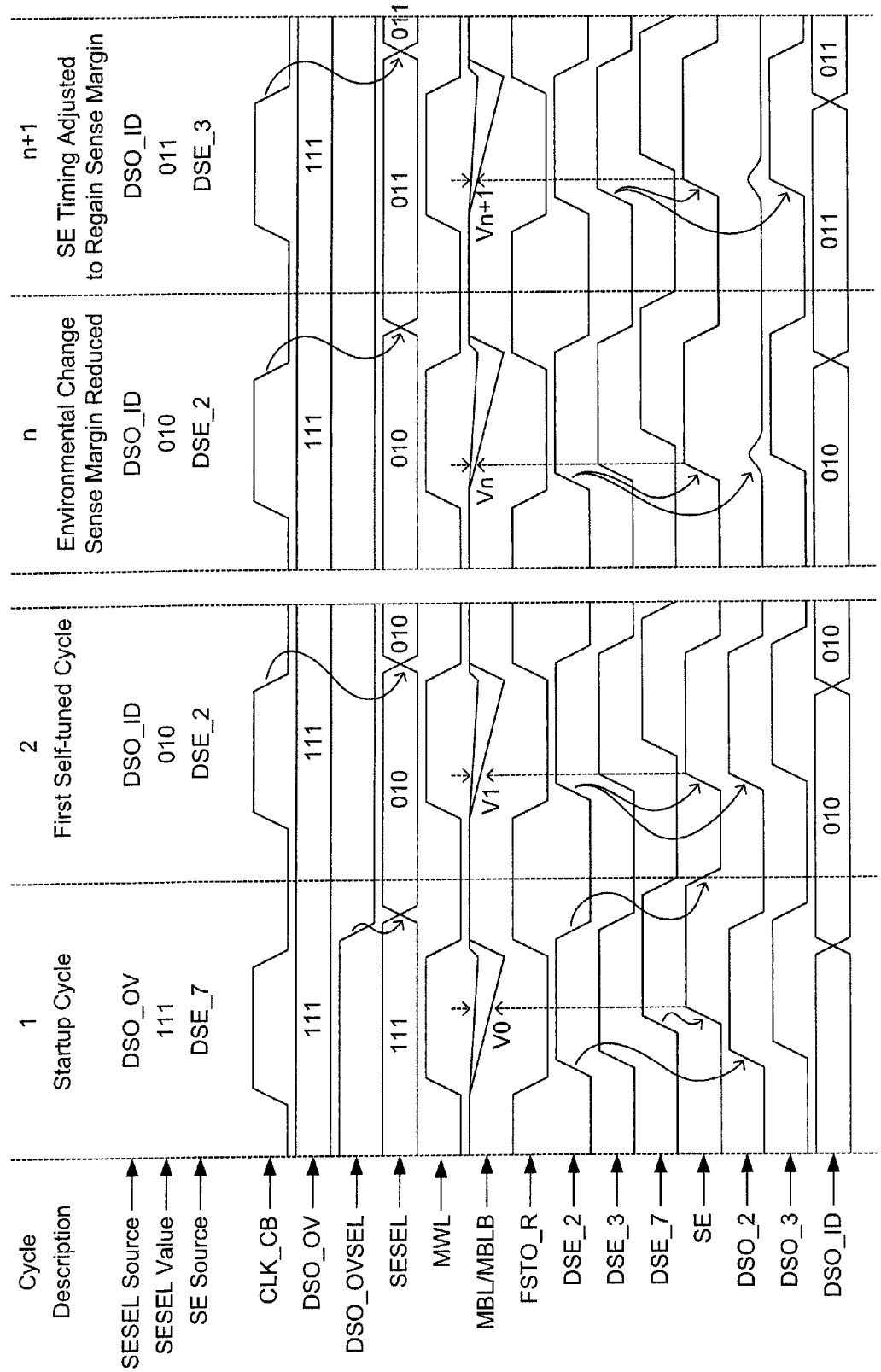
FIG. 6 is an illustration showing a number of exemplary signal waveforms associated with operation of the control block of FIG. 5, in accordance with one embodiment of the present invention.

FIG. 6 is an illustration showing a number of exemplary signal waveforms associated with operation of the control block (CB) 501, in accordance with one embodiment of the present invention. A memory cycle begins at a leading edge of the memory clock signal (CLK_CB). Upon initiation of the memory cycle, the model wordline signal (MWL) is driven high. In response to model wordline signal (MWL) rising, the model bitline driver (MD) will generate the model bitline signal pair (MBL/MBLB). The model bitline signal pair (MBL/MBLB) should look essentially the same as the active core bitline pair (BL/BLB). In one embodiment, the model bitline signal (MBL) drops along with the model bitline complement signal (MBLB), although the generation of signal differential between MBL and MBLB will always occur at a slower rate, due to leakage in the unselected model load cells (ML) reducing the voltage of the (MBL/MBLB) signal that would otherwise remain at a high level. It should be appreciated that due to the model load cells (ML), the drop rate of the active bitline signal pair (BL/BLB) differential due to leakage should not be worse than the drop rate of the model bitline signal pair (MBL/MBLB) differential, thereby ensuring that timing of the model bitline signal pair (MBL/MBLB) will bound a slowest timing of the active bitline signal pair (BL/BLB).

Upon transition of the model wordline signal (MWL), the fast self-timing path (FST_R) will feed the delay element chain 203 in the control block (CB) 501 with the fast timing signal (FSTO_R). The outputs of the delay elements (DE_0-DE_n) in the delay element chain 203 are respectively specified as the dummy sense enable signals (DSE_0-DSE_n). The dummy sense enable signals (DSE_0-DSE_n) are used to clock the dummy sense amplifiers (DSA_0-DSA_n), thereby causing generation of a respective dummy sense output signals (DSO_0-DSO_n).

In the example of FIG. 6, the override select signal (DSO_OVSEL) is asserted in the first memory cycle, thereby causing the identity signal (DSO_OV) to be stored in the register (DSEREG) for use as the select signal (SESEL) in the next memory cycle. Upon initial startup, the maximum delay for the sense enable signal (SE) generation can be set using the override select signal (DSO_OVSEL) and the identity signal (DSO_OV). Then, the override select signal (DSO_OVSEL) is de-asserted, thereby causing the dummy sense enable signal that clocks the first dummy sense amplifier to sense the model bitline signal pair (MBL/MBLB) to be identified for use as the select signal (SESEL) in the next memory cycle. It should be understood that the sense enable signal (SE) for the memory 100 is derived directly from one of the dummy sense enable signals (DSE_0-DSE_n). Also, it should be understood that the selection of which dummy sense enable signal (DSE_0-DSE_n) is used to generate the sense enable signal (SE) is determined in the previous memory cycle.

In the first memory cycle of FIG. 6, the differential voltage V0 shows an excessive sensing margin. Then, in the second memory cycle, the differential voltage V1 shows a corrected sensing margin, based on the dummy sense amplifier output signals (DSO_0-DSO_n) generated in the first memory cycle. Then, in the (n)th memory cycle, the differential voltage Vn shows a reduced sensing margin with respect to the differential voltage V1. Then, in the (n+1)th memory cycle, the differential voltage Vn+1 shows a corrected sensing margin, based on the dummy sense amplifier output signals (DSO_0-DSO_n) generated in the (n)th memory cycle.

With the control block (CB) 501, the active path read margin of the memory 100 should be designed such that it has incrementally more sense margin, i.e., read margin, than the governing dummy sense amplifier within the control block (CB) 501 that is clocked by the same dummy sense enable signal which drives the sense enable signal (SE) for the memory 100. This is so that when environmental changes cause the sensing operation by the governing dummy sense amplifier within the control block (CB) 501 to fail, the active path read cycle will still succeed. Thus, with this approach, the control block (CB) 501 can handle incremental changes in conditions within one memory clock cycle. Moreover, given the close tracking provided by the model bitline path, it can be expected that the control block (CB) 501 will be able to handle most, if not all, changes in conditions from one memory cycle to the next. It should be appreciated that significant changes in conditions can be adjusted for within one memory cycle delay because there is no requirement to update the DSO_ID bus incrementally, i.e., there are no restrictions on the DSO_ID bus state from one cycle to the next.

Figure 7:
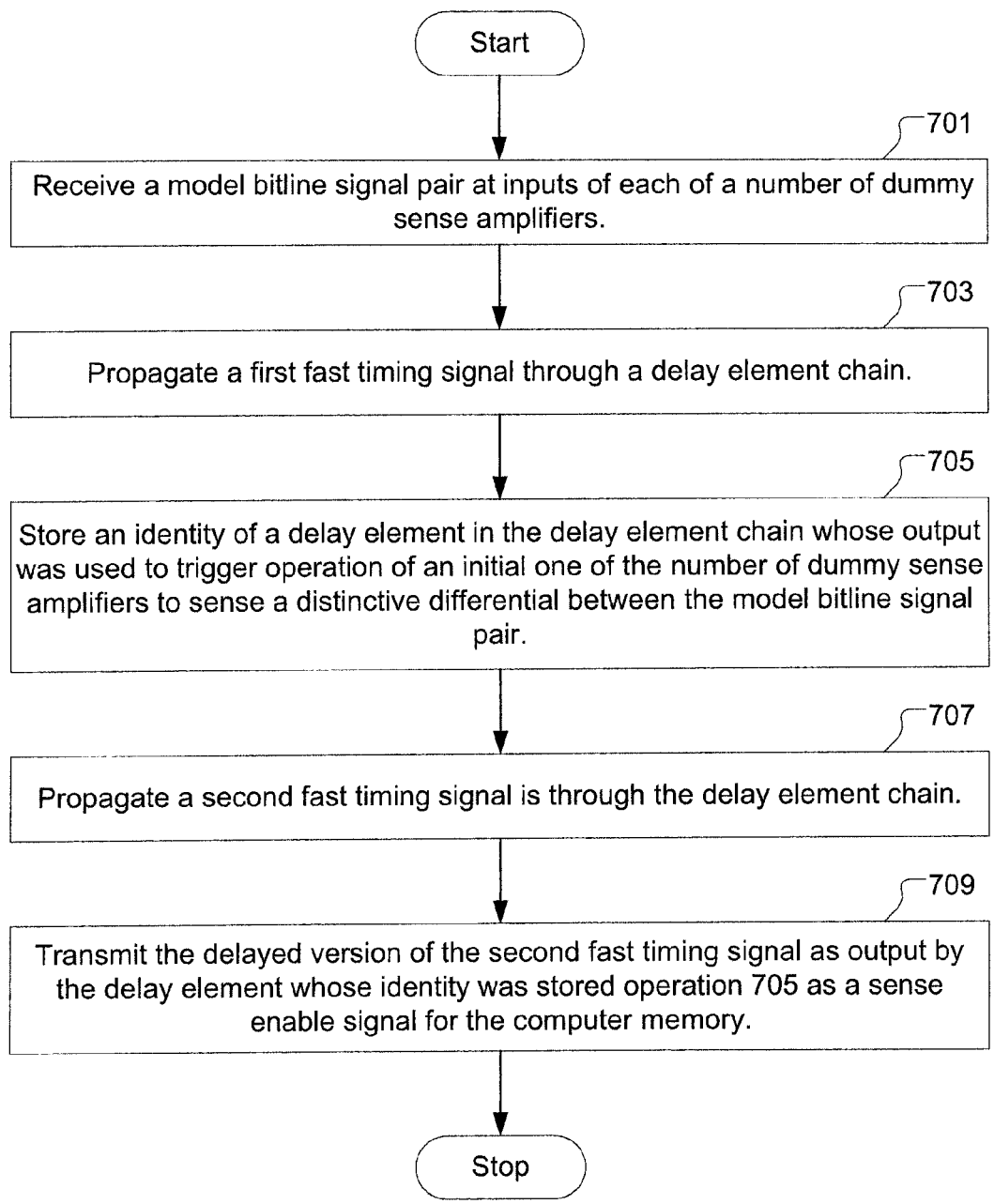
FIG. 7 is an illustration showing a flowchart of a method for operating a computer memory utilizing the control block of FIG. 5, in accordance with one embodiment of the present invention.

FIG. 7 is an illustration showing a flowchart of a method for operating a computer memory utilizing the control block (CB) 501, in accordance with one embodiment of the present invention. The method includes an operation 701 for receiving a model bitline signal pair at inputs of each of a number of dummy sense amplifiers. More specifically, the model bitline signal pair is received in a substantially simultaneously manner at the inputs of each of the number of dummy sense amplifiers. The model bitline signal pair received at inputs of each of the number of dummy sense amplifiers is defined to substantially emulate, with regard to signal characteristics and signal timing, a bitline signal pair to be received at a sense amplifier of the computer memory.

The method also includes a operation 703 for propagating a first fast timing signal through a delay element chain. A respective delayed version of the first fast timing signal output by each element in the delay element chain is transmitted to trigger operation of a respective one of the number of dummy sense amplifiers in a staggered temporal sequence. In one embodiment, the staggered temporal sequence is controlled such that a substantially uniform time delay is provided between successive operation of dummy sense amplifiers. In another embodiment, the staggered temporal sequence is controlled such that a time delay between operation of successive ones of the number of dummy sense amplifiers increases non-linearly.

The method further includes an operation 705 for storing an identity of a delay element in the delay element chain whose output was used to trigger operation of an initial one of the number of dummy sense amplifiers to sense a distinctive differential between the model bitline signal pair. In one embodiment, operation 705 includes storing the identity of the delay element in a register. Also, in an operation 707, a second fast timing signal is propagated through the delay element chain as part of the subsequent memory cycle.

In an operation 709, the delayed version of the second fast timing signal as output by the delay element whose identity was stored in operation 705 is transmitted as a sense enable signal for the computer memory. Operation 709 includes an operation for transmitting an output signal of each delay element in the delay element chain to a respective input of a multiplexer. Operation 709 also includes transmitting the identity of the delay element as stored in operation 705 to a selection input of the multiplexer. Operation 709 further includes operating the multiplexer to transmit the output signal of the delay element identified to the selection input as the sense enable signal for the computer memory.

Although operations 701-709 are performed in each memory cycle, it should be appreciated that operations 707-709 in a given memory cycle are based on the results of operations 701-705 in a previous memory cycle, i.e., in a memory cycle immediately preceding the given memory cycle. In one embodiment, the delayed version of the second fast timing signal transmitted in operation 709 is buffered prior to its transmittal as the sense enable signal for the computer memory. Also, in one embodiment, storage of the delay element identity in operation 705 can be overridden with storage of a user specified delay element identity.

Figure 8:
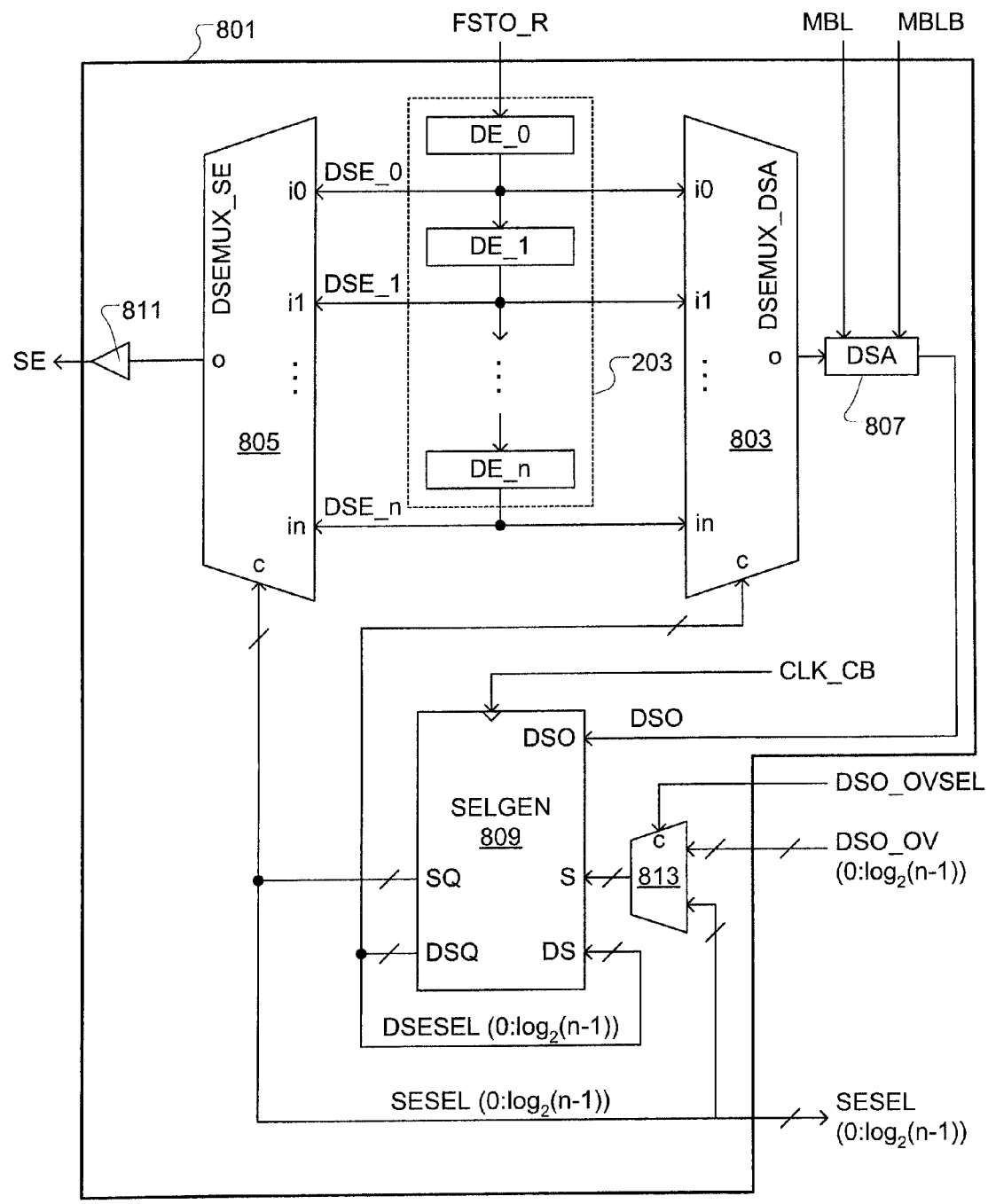
FIG. 8 is an illustration showing a control block defined to provide a speculative sense enable tuning capability, in accordance with one embodiment of the present invention.

FIG. 8 is an illustration showing a control block (CB) 801 defined to provide a speculative sense enable tuning capability, in accordance with one embodiment of the present invention. The control block (CB) 801 is also referred to as a sense enable control module for a computer memory. The control block (CB) 801 is connected to receive the model bitline signal pair (MBL/MBLB) from the same primary self-timing path (PST_R) as previously described with regard to control block (CB) 201. Also, the control block (CB) 801 is defined to receive the fast timing signal (FSTO_R) from the fast self-timing path (FST_R) in the same manner as previously described with regard to the control block (CB) 201.

As with the control block (CB) 201, the control block (CB) 501 includes the delay element chain 203 defined to include the serially connected delay elements (DE_0-DE_n). The delay element chain 203 is connected to receive and propagate therethrough the fast timing signal (FSTO_R). Each delay element (DE_0-DE_n) in the delay element chain 203 has an output connected to communicate a respective dummy sense enable signal (DSE_0-DSE_n), such that the dummy sense enable signals (DSE_0-DSE_n) are generated in a staggered temporal sequence according to a cumulative delay of the fast timing signal (FSTO_R) as propagated through the delay element chain 203. Thus, each dummy sense enable signal (DSE_0-DSE_n) represents a respective delayed version of the timing signal. In one embodiment, the delay elements (DE_0-DE_n) are defined such that a cumulative delay of the fast timing signal (FSTO_R) as propagated through the delay element chain 203 will increase linearly. In another embodiment, the delay elements (DE_0-DE_n) are defined such that a cumulative delay of the fast timing signal (FSTO_R) as propagated through the delay element chain 203 will increase non-linearly. For example, the delay elements near the tail end (DE_n) of the delay element chain 203 may provide a larger signal delay amount than the delay elements near the head end (DE_0) of the delay element chain 203.

The control block (CB) 801 also includes an active side multiplexer (DSEMUX_SE) 805 defined to receive as respective inputs (i(0)-i(n)) each of the delayed versions of the timing signal (DSE_0-DSE_n) as communicated by the outputs of the delay elements (DE_0-DE_n) of the delay element chain 203. The active side multiplexer (DSEMUX_SE) 805 is further defined to receive an active side control signal (SESEL) defined to specify which of the delayed versions of the timing signal (DSE_0-DSE_n) received at the inputs (i(0)-i(n)) of the active side multiplexer (DSEMUX_SE) 805 is to be transmitted through an output (o) of the active side multiplexer (DSEMUX_SE) 805. It should be understood that in one embodiment the active side control signal (SESEL) is a multi-bit signal conveyed on a multi-bit bus, where the number of bits represented in each of the multi-bit signal and the multi-bit bus is set to enable a unique identification any one of the inputs received by the active side multiplexer (DSEMUX_SE) 805. The delayed version of the timing signal as transmitted through the output (o) of the active side multiplexer (DSEMUX_SE) 805 is to serve as the sense enable signal (SE) for the computer memory.

The control block (CB) 801 also includes a calibration side multiplexer (DSEMUX_DSA) 803 defined to receive as respective inputs (i(0)-i(n)) each of the delayed versions of the timing signal (DSE_0-DSE_n) as communicated by the outputs of the delay elements (DE_0-DE_n) of the delay element chain 203. The calibration side multiplexer (DSEMUX_DSA) 803 is further defined to receive a calibration side control signal (DSESEL) defined to specify which of the delayed versions of the timing signal (DSE_0-DSE_n) received at the inputs (i(0)-i(n)) of the calibration side multiplexer (DSEMUX_DSA) 803 is to be transmitted through an output (o) of the calibration side multiplexer (DSEMUX_DSA) 803. It should be understood that in one embodiment the calibration side control signal (DSESEL) is a multi-bit signal conveyed on a multi-bit bus, where the number of bits represented in each of the multi-bit signal and the multi-bit bus is set to enable a unique identification any one of the inputs received by the calibration side multiplexer (DSEMUX_DSA) 803.

The control block (CB) 801 also includes a dummy sense amplifier 807 connected to receive as inputs the model bitline signal pair (MBL/MBLB). The model bitline signal pair (MBL/MBLB) to be received at the inputs of the dummy sense amplifier 807 is defined to substantially emulate, with regard to signal characteristics and signal timing, a bitline signal pair (BL/BLB) to be received at a sense amplifier (SA) of the computer memory 100. The dummy sense amplifier 807 is also connected to receive as a sense enable input signal the delayed version of the timing signal as transmitted through the output (o) of the calibration side multiplexer (DSEMUX_DSA) 803. Therefore, the calibration side multiplexer (DSEMUX_DSA) 803 is defined to serve as the dummy sense enable selection multiplexer for control of the dummy sense amplifier 807.

The dummy sense amplifier 807 is defined to transmit a dummy sense output signal (DSO) indicative of whether a distinctive differential is sensed between the model bitline signal pair (MBL/MBLB) upon receipt of the sense enable input signal from the calibration side multiplexer (DSEMUX_DSA) 803. The distinctive differential is defined as a minimum signal differential required between inputs of the dummy sense amplifier 807 for the dummy sense amplifier 807 to sense a logic state represented by the model bitline signal pair (MBL/MBLB) present at the inputs of the dummy sense amplifier 807. In one embodiment, the dummy sense amplifier 807 is a substantially equivalent replica of a sense amplifier of the computer memory 100. Also, in one embodiment, the dummy sense amplifier 807 is defined to be pre-biased to sense a logic state opposite of a logic state to be communicated by the model bitline signal pair (MBL/MBLB).

The control block (CB) 801 further includes a control input generator (SELGEN) 809 defined to monitor the dummy sense output signal (DSO) and adjust both the active side control signal (SESEL) and the calibration side control signal (DSESEL) based on the monitored state of the dummy sense output signal (DSO). More specifically, the control input generator (SELGEN) 809 is defined to update the active side control signal (SESEL) and the calibration side control signal (DSESEL) based on their state in the previous memory cycle and based on whether or not the dummy sense output signal (DSO) indicates a positive sensing result or a negative sensing result. The positive sensing result indicates that a distinctive differential was sensed between the model bitline signal pair (MBL/MBLB) by the dummy sense amplifier 807. The negative sensing result indicates that a distinctive differential was not sensed between the model bitline signal pair (MBL/MBLB) by the dummy sense amplifier 807.

The control input generator (SELGEN) 809 is defined to operate in accordance with a clock signal (CLK_CB). The control input generator (SELGEN) 809 includes a DSO input for receiving the dummy sense output signal (DSO) from the dummy sense amplifier 807. The control input generator (SELGEN) 809 includes an S input for receiving either the previously generated active side control signal (SESEL) or an override control signal (DSO_OV). An override multiplexer 813 is provided to enable control, by way of an override select signal (DSO_OVSEL), of whether the previously generated active side control signal (SESEL) or the override control signal (DSO_OV) is transmitted to the S input of the control input generator (SELGEN) 809. Upon initial startup, the maximum delay for the sense enable signal (SE) generation can be set using the override select signal (DSO_OVSEL) and the override control signal (DSO_OV). It should be understood that in one embodiment the override control signal (DSO_OV) is a multi-bit signal conveyed on a multi-bit bus, where the number of bits represented in each of the multi-bit signal and the multi-bit bus is set to enable a unique identification any one of the dummy sense enable signals (DSE_i, wherein 0<=i<=n).

The control input generator (SELGEN) 809 also includes a DS input for receiving the previously generated calibration side control signal (DSESEL). Although not shown in FIG. 8, in one embodiment, an override multiplexer similar to the override multiplexer 813 could be connected at the DS input to enable an override of the previously generated DSESEL signal with a user specified signal. Through such an override, a user could specify an initial delay setting to be used for the model bitline signal pair (MBL/MBLB) sense enable. The control input generator (SELGEN) 809 includes an output (SQ) through which the active side control signal (SESEL) is transmitted. The control input generator (SELGEN) 809 also includes an output (DSQ) through which the calibration side control signal (DSESEL) is transmitted.

The control input generator (SELGEN) 809 includes logic defined to query the DSO, S, and DS inputs in each memory cycle to determine an appropriate adjustment to each of the active side control signal (SESEL) and the calibration side control signal (DSESEL). Table 1 below summarizes the function of the control input generator (SELGEN) 809 logic in adjusting the active side control signal (SESEL) and the calibration side control signal (DSESEL) based on the DSO, S, and DS inputs. In Table 1, a DSO value of 0 indicates that the dummy sense output (DSO) represents a negative sensing result. A DSO value of 1 indicates that the dummy sense output (DSO) represents a positive sensing result. If a relationship between the previously generated signals as received at the DS and S inputs is satisfied as shown in a given row of Table 1, and the sensing result received at the DSO input is equal to that shown in the DSO column for the given row, then the active side control signal (SESEL) is adjusted as shown in the SQ column for the given row, and the calibration side control signal (DSESEL) is adjusted as shown in the DSQ column for the given row.

TABLE 1

| DS | DSO | SQ | DSQ |
|---|---|---|---|
| >=S | 0 | S + 1 | DS + 1 |
| <S | 0 | S | DS + 1 |
| >=1 | 1 | S | DS − 1 |
| <S | 1 | S − 1 | DS − 1 |

Thus, according to the logic of Table 1, the control input generator (SELGEN) 809 is defined to adjust the calibration side control signal (DSESEL) so as to transmit a more delayed version of the timing signal through the output of the calibration side multiplexer (DSEMUX_DSA) 803 when the dummy sense output signal (DSO) indicates a negative sensing result. Also, the control input generator (SELGEN) 809 is defined to adjust the calibration side control signal (DSESEL) so as to transmit a less delayed version of the timing signal through the output of the calibration side multiplexer (DSEMUX_DSA) 803 when the dummy sense output signal (DSO) indicates a positive sensing result.

Further, according to the logic of Table 1, the control input generator (SELGEN) 809 is defined to adjust the active side control signal (SESEL) so as to transmit a more delayed version of the timing signal through the output of the active side multiplexer (DSEMUX_SE) 805 when the dummy sense output signal (DSO) indicates a negative sensing result and the output signal from the active side multiplexer (DSEMUX_SE) 805 is delayed less than or equal to the output signal from the calibration side multiplexer (DSEMUX_DSA) 803.

Further, according to the logic of Table 1, the control input generator (SELGEN) 809 is defined to maintain a setting of the active side control signal (SESEL) when the dummy sense output signal (DSO) indicates a negative sensing result and the output signal from the active side multiplexer (DSEMUX_SE) 805 is delayed more than the output signal from the calibration side multiplexer (DSEMUX_DSA) 803. Also, according to the logic of Table 1, the control input generator (SELGEN) 809 is defined to maintain a setting of the active side control signal (SESEL) when the dummy sense output signal (DSO) indicates a positive sensing result and the output signal from the active side multiplexer (DSEMUX_SE) 805 is delayed less than or equal to the output signal from the calibration side multiplexer (DSEMUX_DSA) 803.

Further, according to the logic of Table 1, the control input generator (SELGEN) 809 is defined to adjust the active side control signal (SESEL) so as to transmit a less delayed version of the timing signal through the output of the active side multiplexer (DSEMUX_SE) 805 when the dummy sense output signal (DSO) indicates a positive sensing result and the output signal from the active side multiplexer (DSEMUX_SE) 805 is delayed more than the output signal from the calibration side multiplexer (DSEMUX_DSA) 803.

The timing of the sense enable signal (SE) generation by the control block (CB) 801 will be optimized automatically over a number of memory cycles, when the override select signal (DSO_OVSEL) is set to allow the previously generated active side control signal (SESEL) to ripple through to the S input of the control input generator (SELGEN) 809. It should be appreciated that in the logic of Table 1, the calibration side control signal (DSESEL) is usually more aggressive with respect to delay of the timing signal than the active side control signal (SESEL), so as to ensure that a reduced, i.e., more aggressive, timing signal delay is always being tested. In one embodiment, the control input generator (SELGEN) 809 is defined to sample the DSO, S, and DS inputs in accordance with the clock signal (CLK_CB).

It should be appreciated that state of (DS>=S) should not occur in normal operation. However, if the state of (DS>=S) does occur, a negative sensing result on the dummy sense output (DSO) should be marginal, and the active path sensing should be correct due the presence of additional sense margin caused by inherent delay associated with the process of generating the sense enable signal (SE) for the memory 100. However, if necessary, sense margin can be added by modifying the operation of the control input generator (SELGEN) 809. For example, the tested delay relationship between the previously generated signals as received at the DS and S inputs can be padded to increase sense margin. Table 2 shows a variation on the logical function of the control input generator (SELGEN) 809, as previously described with regard to Table 1, to include a sense margin padding variable (p). The padding value (p) can be a user-configurable parameter. With the padding logic, the generation of the sense enable signal (SE) is delayed by an additional number (p) of delay elements in the delay element chain 203, relative to the number of delay elements used to delay the timing signal for enablement of the dummy sense amplifier 807.

TABLE 2

| DS | DSO | SQ | DSQ |
|---|---|---|---|
| >=S − (p) | 0 | S + 1 | DS + 1 |
| <S − (p) | 0 | S | DS + 1 |
| >=S − (p) | 1 | S | DS − 1 |
| <S − (p) | 1 | S − 1 | DS − 1 |

In the control block (CB) 801, the primary self-timing path (PST_R) is used to calibrate the sense enable signal (SE) generation for subsequent memory cycles by updating the dummy sense enable signal (DSE) selection. In some rare instances, this approach may not provide for instant dummy sense enable (DSE) selection updating within the same cycle in which there may be rapid changes in the environment. However, the types of environmental changes that can affect circuit operation significantly within one cycle are handled by the sense enable signal (SE) buffering margin and basic delay tracking by the fast self-timing path (FSTO_R). Therefore, limiting the dummy sense enable signal (DSE) selection change to one position per cycle is likely to offer sufficient self-tuning response time to effectively cover the self-tuning mandate, which is to avoid excess or insufficient sense margin in normal operation of the memory 100. The control block (CB) 801 requires less chip area due to use of the single dummy sense amplifier 807. Also, in the control block (CB) 801, the loading on model bitline signal pair (MBL/MBLB) is reduced.

Figure 9:
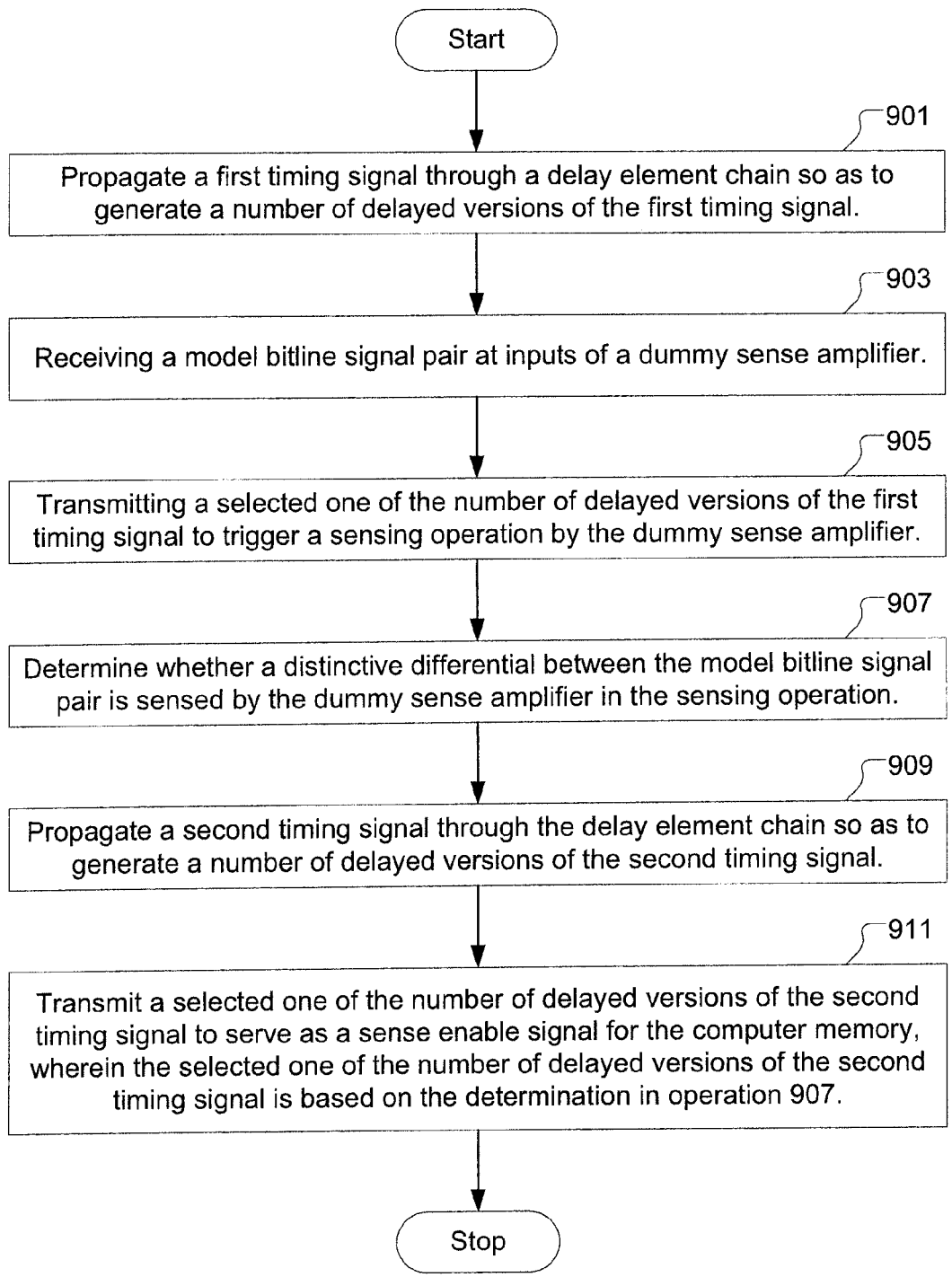
FIG. 9 is an illustration showing a flowchart of a method for operating a computer memory utilizing the control block of FIG. 8, in accordance with one embodiment of the present invention.

FIG. 9 is an illustration showing a flowchart of a method for operating a computer memory utilizing the control block (CB) 801, in accordance with one embodiment of the present invention. The method includes an operation 901 for propagating a first timing signal through a delay element chain so as to generate a number of delayed versions of the first timing signal. The method also includes an operation 903 for receiving a model bitline signal pair at inputs of a dummy sense amplifier. The method further includes an operation 905 for transmitting a selected one of the number of delayed versions of the first timing signal to trigger a sensing operation by the dummy sense amplifier. The method further includes an operation 907 for determining whether a distinctive differential between the model bitline signal pair is sensed by the dummy sense amplifier in the sensing operation.

In an operation 909, a second timing signal is propagated through the delay element chain so as to generate a number of delayed versions of the second timing signal. Also, in an operation 911, a selected one of the number of delayed versions of the second timing signal is transmitted to serve as a sense enable signal for the computer memory. The selected one of the number of delayed versions of the second timing signal is selected based on the determination of whether a distinctive differential exists between the model bitline signal pair in the operation 907.

In the method of FIG. 9, a positive sensing result exists (DSO=1) when a distinctive differential is sensed between the model bitline signal pair (MBL/MBLB) by the dummy sense amplifier (DSA 807). Also, a negative sensing result exists (DSO=0) when a distinctive differential is not sensed between the model bitline signal pair (MBL/MBLB) by the dummy sense amplifier (DSA 807). The method further includes an operation for transmitting through the calibration side multiplexer (803) in a next memory cycle a timing signal that is a more delayed version of the first timing signal (DSQ=DS+1) to trigger a sensing operation by the dummy sense amplifier (DSA) when a negative sensing result exists (DSO=0). The method further includes an operation for transmitting through the calibration side multiplexer (803) in a next memory cycle a timing signal that is a less delayed version of the first timing signal (DSQ=DS−1) to trigger a sensing operation by the dummy sense amplifier (DSA) when a positive sensing result exists (DSO=1).

The method further includes an operation for transmitting through the active side multiplexer (805) in a next memory cycle a timing signal that is a more delayed version of the second timing signal (SQ=S+1) to serve as the sense enable signal (SE) for the computer memory, when a negative sensing result exists (DSO=0) and the previously transmitted version of the second timing signal is delayed less than or equal to a previously transmitted version of the first timing signal (S<=DS or (S−(p))<=DS). The method further includes an operation for transmitting through the active side multiplexer (805) in a next memory cycle a timing signal that is timed the same as the previously transmitted version of the second timing signal (SQ=S) to serve as the sense enable signal (SE) for the computer memory, when a negative sensing result exists (DSO=0) and the previously transmitted version of the second timing signal is delayed more than the previously transmitted version of the first timing signal (S>DS or (S−(p))>DS).

The method further includes an operation for transmitting through the active side multiplexer (805) in a next memory cycle a timing signal that is timed the same as the previously transmitted version of the second timing signal (SQ=S) to serve as the sense enable signal (SE) for the computer memory, when a positive sensing result exists (DSO=1) and the previously transmitted version of the second timing signal is delayed less than or equal to the previously transmitted version of the first timing signal (S<=DS or (S−(p))<=DS). The method further includes an operation for transmitting through the active side multiplexer (805) in a next memory cycle a timing signal that is a less delayed version of the second timing signal (SQ=S−1) to serve as the sense enable signal (SE) for the computer memory, when a positive sensing result exists (DSO=1) and the previously transmitted version of the second timing signal is delayed more than the previously transmitted version of the first timing signal (S>DS or (S−(p))>DS).

It should be understood that the memory 100 as described herein may be a stand-alone memory, or may be a portion of a memory bank, or may be a memory bank itself, wherein each such memory bank has its own timing path and may be part of a larger memory. It should be further understood that while the memory 100 operations described herein, including the operations of the primary self-timing path (PST_R), the fast self-timing path (FST_R), and the control block (CB) embodiments 201, 501, 801, have been described primarily in terms of memory read operations, similar concepts and principles as described herein may be equally applicable to memory write operations. For example, in a write operation, the primary self-timing path (PST_R) and fast self-timing path (FST_R) can be used with a modified control block (CB) to emulate and measure timing associated with an active core write event. For example, one of the previously described control blocks (CB) 201, 501, 801 can be modified to replace the dummy sense amplifiers therein with dummy core cells so as to emulate and measure the timing associated with the flipping of a logic state in a core cell during a write operation. This emulated timing measurement can be used to control the memory write operation, such as the de-activation time of the wordline and/or pre-charge of the bitlines used to write the cell. Therefore, the various embodiments of the present invention as described herein with respect to memory read operations should be understood to be extendable, as least in part, to memory write operations.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A computer memory, comprising:
    a primary self-timing signal path defined by a model wordline signal path and a model bitline signal pair path, the primary self-timing signal path defined to generate and transmit a model bitline signal pair, wherein the model bitline signal pair is essentially identical to an active bitline signal pair of the computer memory with regard to a rate of signal generation; and
    a control block defined to receive the model bitline signal pair from the primary self-timing signal path, the control block defined to sense when a distinctive differential exists between the signals of the model bitline signal pair, the control block further defined to generate and transmit a sense enable signal to a memory core upon sensing the distinctive differential between the signals of the model bitline signal pair.

2. A computer memory as recited in claim 1, wherein the model wordline signal path of the primary self-timing signal path is defined to emulate a wordline signal path within the memory core, and wherein the model bitline signal pair path of the primary self-timing signal path is defined to emulate a bitline signal pair path within the memory core.

3. A computer memory as recited in claim 1, wherein the model wordline signal path is connected to a number of model core cells, the number of model core cells equal to a number of core cells to which each wordline signal path within the memory core is connected, the model wordline signal path further connected to terminate at a model bitline driver.

4. A computer memory as recited in claim 3, wherein the model bitline driver is defined to be substantially equivalent to a core cell within the memory core.

5. A computer memory as recited in claim 4, wherein the model bitline signal pair path is connected to a number of model load cells, the number of model load cells equal to a number of wordline signal paths within the memory core.

6. A computer memory as recited in claim 5, wherein each model load cell is defined to be substantially equivalent to a core cell within the memory core.

7. A computer memory as recited in claim 6, wherein each model load cell is defined to store a logic state opposite of a logic state to be driven by the model bitline driver so as to emulate a maximum leakage that may be experienced through a full bitline signal pair path within the memory core.

8. A computer memory as recited in claim 1, wherein the control block is defined to include a number of dummy sense amplifiers connected to be enabled in a staggered temporal sequence, wherein each of the number of dummy sense amplifiers is defined as a differential sense amplifier capable upon enablement of sensing whether the distinctive differential exists between the signals of the model bitline signal pair.

9. A computer memory as recited in claim 8, wherein the control block is defined to drive the sense enable signal to the memory core immediately upon an initial sensing by any one of the number of dummy sense amplifiers of the existence of the distinctive differential between the signals of the model bitline signal pair.

10. A computer memory as recited in claim 8, wherein the control block is defined to store in a first memory cycle an identity associated with one of the dummy sense amplifiers having initially sensed the existence of the distinctive differential between the signals of the model bitline signal pair in the first memory cycle, and wherein the control block is further defined to drive the sense enable signal to the memory core in a second memory cycle in accordance with generation in the second memory cycle of a signal used to enable the dummy sense amplifier whose identity was stored in the first memory cycle.

11. A sense enable control module for a computer memory, comprising:
    a plurality of dummy sense amplifiers each connected to receive a model bitline signal pair, each of the plurality of dummy sense amplifiers defined to receive a dummy sense enable signal and produce a dummy sense output signal indicative of whether a distinctive differential is sensed between the model bitline signal pair upon receipt of the dummy sense enable signal;
    a delay element chain including a plurality of serially connected delay elements, the delay element chain connected to receive and propagate therethrough a fast timing signal, each delay element in the delay element chain having an output connected to communicate a respective dummy sense enable signal to a respective one of the plurality of dummy sense amplifiers such that the plurality of dummy sense amplifiers are enabled in a staggered temporal sequence according to a cumulative delay of the fast timing signal as propagated through the delay element chain; and
    a memory core sense enable signal generator defined to receive the dummy sense output signal from each of the plurality dummy sense amplifiers, the memory core sense enable signal generator defined to drive a sense enable signal for a memory core upon an initial receipt of a dummy sense output signal from any one of the plurality of dummy sense amplifiers indicative of the distinctive differential having been sensed between the model bitline signal pair.

12. A sense enable control module for a computer memory as recited in claim 11, wherein the memory core sense enable signal generator is connected to each of a number of sense amplifiers of the computer memory so as to drive the sense enable signal to a sense enable input on each of the number of sense amplifiers of the computer memory.

13. A sense enable control module for a computer memory as recited in claim 11, wherein each of the plurality of dummy sense amplifiers is a substantially equivalent replica of a sense amplifier of the computer memory.

14. A sense enable control module for a computer memory as recited in claim 11, wherein the distinctive differential is defined as a minimum differential required between inputs of a given dummy sense amplifier for the given dummy sense amplifier to sense a logic state represented by the signals present at the inputs of the given dummy sense amplifier.

15. A sense enable control module for a computer memory as recited in claim 11, wherein each of the plurality of dummy sense amplifiers is defined to be pre-biased to sense a logic state opposite of a logic state to be communicated by the model bitline signal pair.

16. A sense enable control module for a computer memory as recited in claim 11, wherein the plurality of serially connected delay elements is defined such that the cumulative delay of the fast timing signal as propagated through the delay element chain will increase linearly.

17. A sense enable control module for a computer memory as recited in claim 11, wherein the plurality of serially connected delay elements is defined such that the cumulative delay of the fast timing signal as propagated through the delay element chain will increase non-linearly, such that delay elements near a tail end of the delay element chain are defined to delay the fast timing signal more than delay elements near a head end of the delay element chain.

18. A sense enable control module for a computer memory as recited in claim 11, wherein each delay element is defined as a number of serially connected buffers or as a number of serially connected inverters.

19. A sense enable control module for a computer memory as recited in claim 11, wherein the plurality of dummy sense amplifiers, the delay element chain, and the memory core sense enable signal generator are collectively defined to operate within a single memory cycle to both determine an appropriate time at which the sense enable signal for the memory core is to be transmitted and drive the sense enable signal for the memory core at the appropriate time.

20. A sense enable control module for a computer memory as recited in claim 11, wherein the memory core sense enable signal generator is further defined to receive an override signal identifying a particular one of the plurality of dummy sense amplifiers and drive the sense enable signal for the memory core upon receipt of a dummy sense output signal from the particular one of the plurality of dummy sense amplifiers identified by the override signal.

21. A sense enable control module for a computer memory as recited in claim 11, wherein the memory core sense enable signal generator is further defined to receive a delay adjustment signal identifying an amount of time by which to delay a driving of the sense enable signal for the memory core following the initial receipt of the dummy sense output signal from any one of the plurality of dummy sense amplifiers indicative of the distinctive differential having been sensed between the model bitline signal pair.

22. A sense enable control module for a computer memory as recited in claim 11, wherein the memory core sense enable signal generator is further defined to output a signal identifying which one of the plurality of dummy sense amplifiers initially provides to the memory core sense enable signal generator the dummy sense output signal indicative of the distinctive differential having been sensed between the model bitline signal pair.

23. A method for operating a computer memory, comprising:
    receiving a model bitline signal pair at inputs of each of a number of dummy sense amplifiers;
    triggering operation of the number of dummy sense amplifiers in a staggered temporal sequence;
    transmitting an output signal of an initial one of the number of dummy sense amplifiers to sense a distinctive differential between the model bitline signal pair, wherein the output signal is transmitted to serve as a sense enable signal for the computer memory; and
    propagating a fast timing signal through a delay element chain, wherein a delayed version of the fast timing signal output by each element in the delay element chain is transmitted to enable a respective one of the number of dummy sense amplifiers so as to trigger operation of the number of dummy sense amplifiers in the staggered temporal sequence.

24. A method for operating a computer memory as recited in claim 23, wherein the operations of receiving, triggering, and transmitting are collectively performed in a single memory cycle.

25. A method for operating a computer memory as recited in claim 23, wherein the model bitline signal pair is received in a substantially simultaneous manner at the inputs of each of the number of dummy sense amplifiers.

26. A method for operating a computer memory as recited in claim 23, further comprising:
    controlling the staggered temporal sequence such that a substantially uniform time delay is provided between successive operation of dummy sense amplifiers.

27. A method for operating a computer memory as recited in claim 23, further comprising:
    controlling the staggered temporal sequence such that a time delay between operation of successive ones of the number of dummy sense amplifiers increases through a memory cycle.

28. A method for operating a computer memory as recited in claim 23, wherein the model bitline signal pair received at inputs of each of the number of dummy sense amplifiers is defined to substantially emulate, with regard to signal characteristics and signal timing, a bitline signal pair to be received at a sense amplifier of the computer memory.

29. A method for operating a computer memory as recited in claim 23, further comprising:
    receiving an override signal identifying a particular one of the number of dummy sense amplifiers; and
    in response to receipt of the override signal, transmitting an output signal of the particular one of the number of dummy sense amplifiers as the sense enable signal for the computer memory.

30. A method for operating a computer memory as recited in claim 23, further comprising:
    delaying by a user specified amount of time the transmitting of the output signal of the initial one of the number of dummy sense amplifiers to sense the distinctive differential between the model bitline signal pair.

31. A method for operating a computer memory as recited in claim 23, further comprising:
    generating a diagnostic signal identifying the initial one of the number of dummy sense amplifiers to sense the distinctive differential between the model bitline signal pair.

* * * * *